(12) United States Patent  
Kim et al.

(10) Patent No.: US 9,553,226 B2
(45) Date of Patent: Jan. 24, 2017

(54) SOLAR CELL MODULE AND METHOD FOR MANUFACTURING THE SAME

(71) Applicant: LG ELECTRONICS INC., Seoul (KR)

(72) Inventors: Bojoong Kim, Seoul (KR); Minpyo Kim, Seoul (KR); Daehee Jang, Seoul (KR); Hyeyoung Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/629,114

(22) Filed: Feb. 23, 2015

(65) Prior Publication Data

US 2015/0243818 A1 Aug. 27, 2015

(30) Foreign Application Priority Data

Feb. 24, 2014 (KR) .................. 10-2014-0021563

(51) Int. Cl.
*H01L 31/05* (2014.01)
*H01L 31/0224* (2006.01)
*H01L 31/068* (2012.01)

(52) U.S. Cl.
CPC ... *H01L 31/0516* (2013.01); *H01L 31/022441* (2013.01); *H01L 31/0504* (2013.01); *H01L 31/0682* (2013.01); *Y02E 10/50* (2013.01); *Y02P 70/521* (2015.11)

(58) Field of Classification Search
CPC .................. H01L 31/0516; H01L 31/022441; Y02E 10/50; Y02P 70/521
See application file for complete search history.

(56) References Cited

U.S. PATENT DOCUMENTS

| 6,337,522 B1 * | 1/2002 | Kang ............ H05K 3/321 257/673 |
|---|---|---|
| 2002/0134422 A1 | 9/2002 | Bauman et al. |
| 2005/0268959 A1 | 12/2005 | Aschenbrenner et al. |
| 2008/0023069 A1 | 1/2008 | Terada et al. |
| 2008/0029875 A1 * | 2/2008 | Zhuang ............ H01L 23/04 257/691 |
| 2008/0216887 A1 | 9/2008 | Hacke et al. |

(Continued)

FOREIGN PATENT DOCUMENTS

| CN | 101395722 A | 3/2009 |
|---|---|---|
| CN | 102473767 A | 5/2012 |

(Continued)

*Primary Examiner* — Michele Fan
(74) *Attorney, Agent, or Firm* — Birch, Stewart, Kolasch & Birch, LLP

(57) ABSTRACT

A method for manufacturing a solar cell module includes a cell forming operation of forming a plurality of first and second electrodes on a back surface of a semiconductor substrate to form each a plurality of solar cells, and a tabbing operation including at least one of a connection operation of performing a thermal process to respectively connect a first conductive line and a second conductive line to the first electrodes and the second electrodes of each solar cell using a conductive adhesive and an optional string forming operation of performing a thermal process to connect the first conductive line included in one solar cell and the second conductive line included in other solar cell adjacent to the one solar cell to an interconnect. The tabbing operation includes at least two thermal processes each having a different maximum temperature.

15 Claims, 27 Drawing Sheets

(56) References Cited

U.S. PATENT DOCUMENTS

| | | | |
|---|---|---|---|
| 2009/0126788 A1* | 5/2009 | Hishida | H01L 31/022458 136/256 |
| 2010/0018565 A1* | 1/2010 | Funakoshi | H01L 31/022433 136/244 |
| 2011/0272006 A1* | 11/2011 | Sainoo | H01L 31/048 136/251 |
| 2011/0315188 A1 | 12/2011 | Hong et al. | |
| 2012/0037203 A1* | 2/2012 | Sainoo | B32B 17/10018 136/244 |
| 2012/0097245 A1* | 4/2012 | Nishina | H01L 31/048 136/256 |
| 2012/0103415 A1* | 5/2012 | Sainoo | H01L 31/0516 136/256 |
| 2012/0216860 A1* | 8/2012 | Sainoo | H01L 31/0516 136/256 |
| 2012/0240984 A1* | 9/2012 | Kim | H01L 31/048 136/251 |
| 2012/0291838 A1 | 11/2012 | Jang | |
| 2012/0305632 A1* | 12/2012 | Ross | H01L 24/83 228/180.21 |
| 2013/0081675 A1 | 4/2013 | Joe et al. | |
| 2013/0284260 A1* | 10/2013 | Naito | H01L 31/022441 136/256 |

FOREIGN PATENT DOCUMENTS

| | | |
|---|---|---|
| EP | 2 009 701 A1 | 12/2008 |
| EP | 2 109 149 A1 | 10/2009 |
| EP | 2 439 784 A1 | 4/2012 |
| EP | 2 575 184 A2 | 4/2013 |
| EP | 2 615 146 A2 | 7/2013 |
| EP | 2 624 303 A1 | 8/2013 |
| EP | 2 669 955 A1 | 12/2013 |
| JP | 62-223276 A | 10/1987 |
| JP | 2003-110123 A | 4/2003 |
| JP | 2008-502149 A | 1/2008 |
| JP | 2008-34592 A | 2/2008 |
| JP | 2009-206366 A | 9/2009 |
| JP | 2009-238959 A | 10/2009 |
| JP | 2010-258158 A | 11/2010 |
| JP | 2011-88165 A | 5/2011 |
| JP | 4885331 B2 | 2/2012 |
| JP | 2012-64871 A | 3/2012 |
| JP | 2012-138533 A | 7/2012 |
| JP | 2013-77820 A | 4/2013 |
| JP | 2013-157602 A | 8/2013 |
| WO | WO 2008/090718 A1 | 7/2008 |
| WO | WO 2010/027265 A2 | 3/2010 |
| WO | WO 2012/173487 A1 | 12/2012 |

* cited by examiner

SOLAR CELL MODULE AND METHOD FOR MANUFACTURING THE SAME

CROSS-REFERENCE TO RELATED APPLICATION

This application claims priority to and the benefit of Korean Patent Application No. 10-2014-0021563 filed in the Korean Intellectual Property Office on Feb. 24, 2014, the entire contents of which are incorporated herein by reference.

BACKGROUND OF THE INVENTION

Field of the Invention

Embodiments of the invention relate to a solar cell module and a method for manufacturing the same.

Description of the Related Art

A solar cell generally includes a substrate and an emitter region, which are formed of semiconductors of different conductive types, for example, a p-type and an n-type, and electrodes respectively connected to the substrate and the emitter region. A p-n junction is formed at an interface between the substrate and the emitter region.

In particular, a solar cell, in which electrodes are not formed on a light receiving surface of a silicon substrate and n-type electrodes and p-type electrodes are formed only on another surface of the silicon substrate, has been continuously studied and developed, so as to increase efficiency of the solar cell. Further, a module technology for electrically connecting the plurality of solar cells each having the above-described configuration has been continuously studied and developed.

Examples of the module technology typically include a method for electrically connecting the plurality of solar cells using metal interconnectors and a method for electrically connecting the plurality of solar cells using a wiring substrate, on which wires are previously formed.

SUMMARY OF THE INVENTION

In one aspect, there is a method for manufacturing a solar cell module including a cell forming operation of forming a plurality of first electrodes and a plurality of second electrodes, positioned in parallel with each other on a back surface of a semiconductor substrate, at which a p-n junction is formed for each of a plurality of solar cells; and a tabbing operation including at least one of a connection operation of performing a thermal process to connect a first conductive line to the plurality of first electrodes included in each of the plurality of solar cells using a conductive adhesive and to connect a second conductive line to the plurality of second electrodes included in each of the plurality of solar cells using the conductive adhesive and an optional string forming operation of performing a thermal process and connecting the first conductive line included in one solar cell and the second conductive line included in other solar cell adjacent to the one solar cell to an interconnect to form a string, in which the plurality of solar cells are connected in series in a first direction, wherein the tabbing operation including at least one of the connection operation and the string forming operation includes at least two thermal processes each having a different maximum temperature.

A plurality of first connection points may be positioned in a portion where the plurality of first electrodes and the first conductive line cross or overlap each other, and a plurality of second connection points may be positioned in a portion where the plurality of second electrodes and the second conductive line cross or overlap each other. The connection operation may include a thermal process of the plurality of first connection points and the plurality of second connection points at a first maximum temperature and a thermal process of the plurality of first connection points and the plurality of second connection points at a second maximum temperature different from the first maximum temperature.

The connection operation may include a temporary attachment process for thermally processing at least a portion of the plurality of first connection points and at least a portion of the plurality of second connection points at the first maximum temperature, and a main attachment process for thermally processing all of the first and second connection points including the at least a portion of the plurality of first and second connection points at the second maximum temperature higher than the first maximum temperature.

The first maximum temperature of the temporary attachment process may be 70° C. to 150° C., and the second maximum temperature of the main attachment process may be 140° C. to 400° C. within a temperature range higher than the first maximum temperature.

The connection operation may include a high melting point thermal process for thermally processing a portion of the plurality of first connection points and a portion of the plurality of second connection points at the first maximum temperature, and a low melting point thermal process for thermally processing remaining first and second connection points among the plurality of first and second connection points at the second maximum temperature lower than the first maximum temperature.

The first maximum temperature of the high melting point thermal process may be 150° C. to 400° C., and the second maximum temperature of the low melting point thermal process may be 140° C. to 180° C. within a temperature range lower than the first maximum temperature.

The first and second conductive lines may be previously patterned on an insulating member. In the connection operation, each insulating member having the first and second conductive lines and each semiconductor substrate, on which the plurality of first and second electrodes are formed, may be connected to each other to form an individual integrated type element.

in the connection operation, an insulating layer may be formed between the first and second electrodes and between the first and second conductive lines.

Each of the first and second conductive lines may be formed as a plurality of conductive wires extending in the first direction or a plurality of conductive ribbons extending in the first direction. In the connection operation, the first and second conductive lines formed as the conductive wires or the conductive ribbons may be respectively connected to the plurality of first and second electrodes of each solar cell.

Each of the first and second conductive lines may overlap two semiconductor substrates of two adjacent solar cells. The two adjacent solar cells may be connected in series to each other to form the string in the connection operation, and the string forming operation may be omitted.

The tabbing operation may include the connection operation and the string forming operation. A maximum temperature of the thermal process of the connection operation may be different from a maximum temperature of the thermal process of the string forming operation.

The maximum temperature of the thermal process of the connection operation may be 140° C. to 400° C. The maximum temperature of the thermal process of the string forming operation may be different from the maximum temperature of the thermal process of the connection operation within a temperature range of 140° C. to 400° C.

For example, the maximum temperature of the thermal process of the string forming operation may be higher than the maximum temperature of the thermal process of the connection operation.

More specifically, the maximum temperature of the thermal process of the connection operation may be 140° C. to 180° C., and the maximum temperature of the thermal process of the string forming operation may be 150° C. to 300° C. within a temperature range higher than the maximum temperature of the thermal process of the connection operation.

For example, the maximum temperature of the thermal process of the string forming operation may be 240° C. to 280° C.

The thermal process of the string forming operation may include a temporary attachment process and a main attachment process performed at a maximum temperature higher than a maximum temperature of the temporary attachment process. The maximum temperature of the temporary attachment process of the string forming operation may be 80° C. to 100° C., and the maximum temperature of the main attachment process of the string forming operation may be 170° C. to 190° C.

The tabbing operation may further include a string connection operation of performing a thermal process and connecting the first conductive line connected to the last solar cell positioned at an end of one string extending in the first direction and the second conductive line connected to the last solar cell positioned at an end of other string, that is adjacent to the one string and extends in the first direction, to a bussing ribbon extending in a second direction crossing the first direction to connect the two adjacent strings. A maximum temperature of the thermal process of the string connection operation may be different from a maximum temperature of the thermal process of the string forming operation.

The maximum temperature of the thermal process of the string connection operation and the maximum temperature of the thermal process of the string forming operation may be different from each other within a temperature range of 140° C. to 400° C.

In another aspect, there is a solar cell module including a plurality of solar cells each including a semiconductor substrate and a plurality of first electrodes and a plurality of second electrodes, which are formed on a back surface of the semiconductor substrate and are separated from each other, and a plurality of conductive lines connected to the plurality of first electrodes included in one of the plurality of solar cells and the plurality of second electrodes included in other solar cell adjacent to the one solar cell, wherein a longitudinal direction of the plurality of conductive lines crosses a longitudinal direction of the plurality of first and second electrodes.

A conductive adhesive may connect the plurality of conductive lines to the plurality of first electrodes of the one solar cell and may connect the plurality of conductive lines to the plurality of second electrodes of the other solar cell.

An insulating layer may be positioned between each of the plurality of conductive lines and each of the plurality of second electrodes of the one solar cell and between each of the plurality of conductive lines and each of the plurality of first electrodes of the other solar cell.

A formation area of the insulating layer may be different from a formation area of the conductive adhesive at the back surface of the semiconductor substrate. More specifically, the formation area of the insulating layer may be greater than the formation area of the conductive adhesive at the back surface of the semiconductor substrate.

A metal pad extending in a direction, that is the same as the longitudinal direction of the plurality of first and second electrodes, may be connected to a portion of each of the plurality of conductive lines exposed between the one solar cell and the other solar cell.

Each of the plurality of conductive lines may use a conductive wire or a conductive ribbon having a stripe shape extending in one direction.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be paid attention that detailed description of known arts will be omitted if it is determined that the arts can mislead the embodiments of the invention.

In the following description, "front surface" may be one surface of a solar cell, on which light is directly incident, and "back surface" may be a surface opposite the one surface of the solar cell, on which light is not directly incident or reflective light may be incident.

Exemplary embodiments of the invention will be described with reference to FIGS. 1 to 32.

Various examples of a solar cell module according to one example embodiment of the invention will be described, and then various examples of a method for manufacturing the solar cell module will be described.

FIGS. 1 to 5 illustrate a first example of a solar cell module manufactured in accordance with one example embodiment of the invention.

Figure 1:
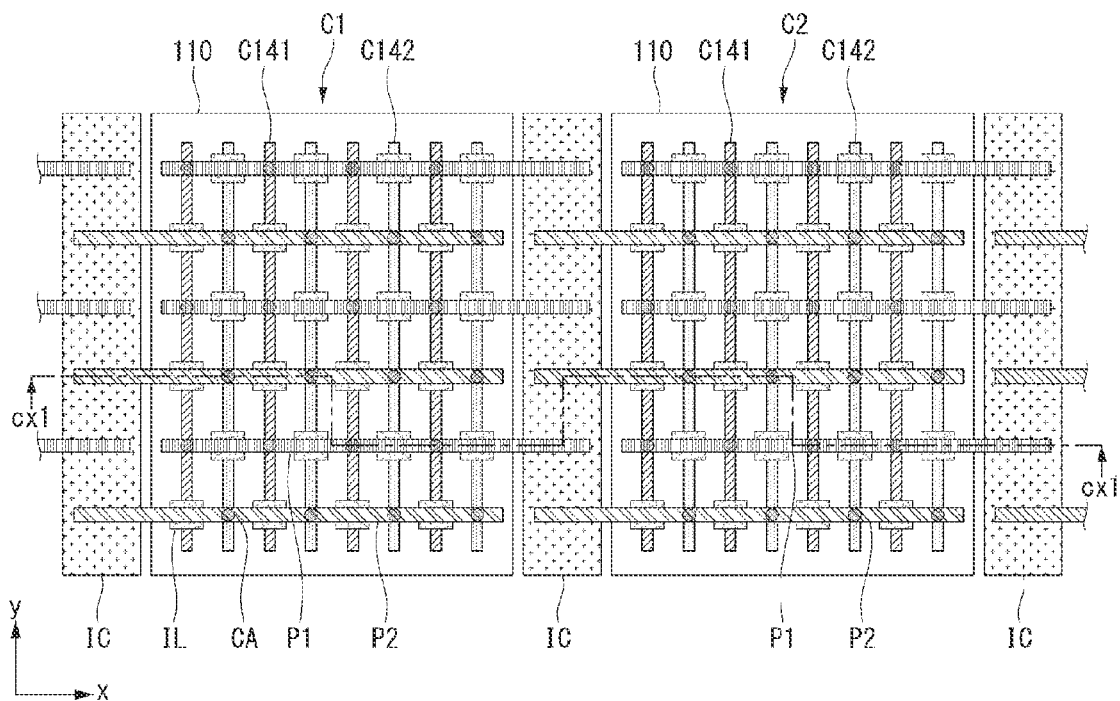
FIGS. 1 to 5 illustrate a first example of a solar cell module manufactured in accordance with one example embodiment of the invention.
Figure 2:
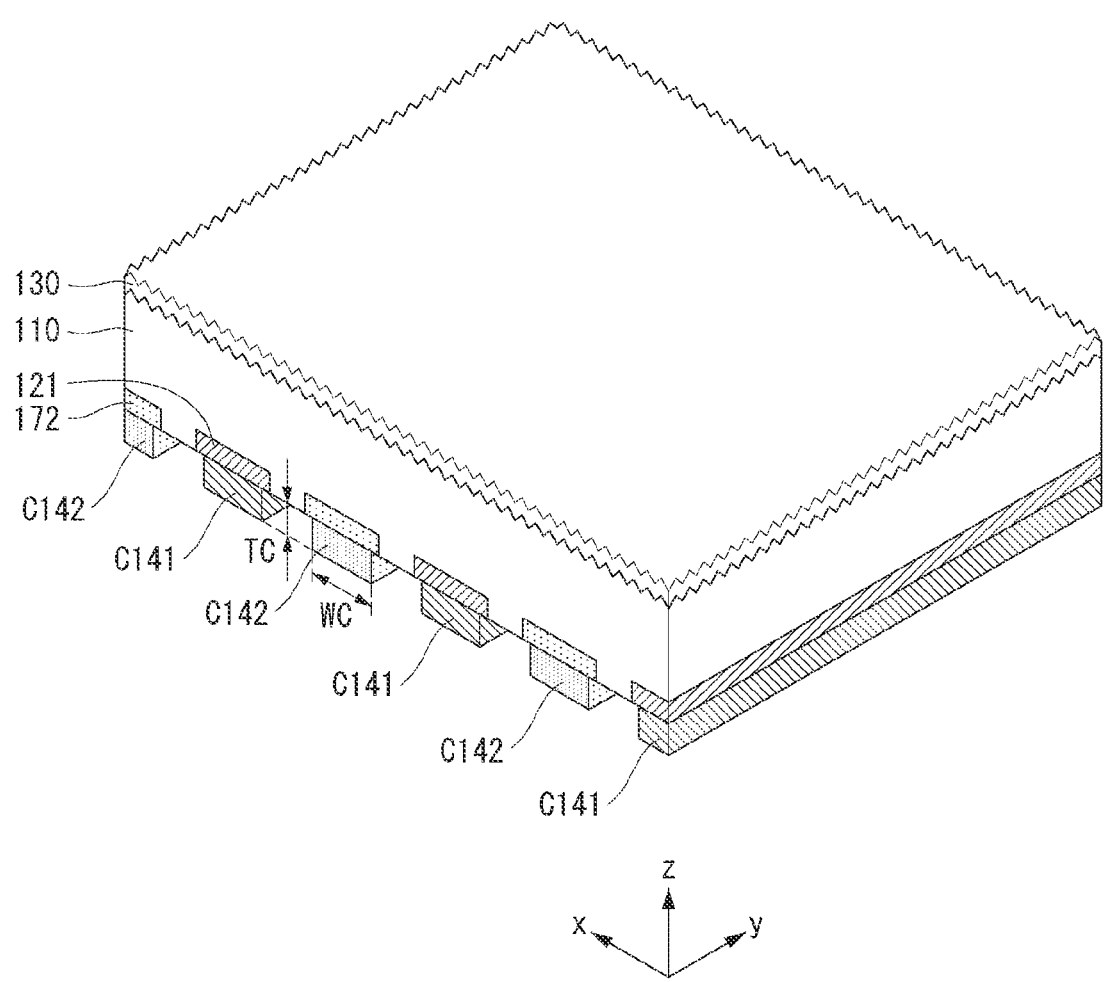
Figure 3:
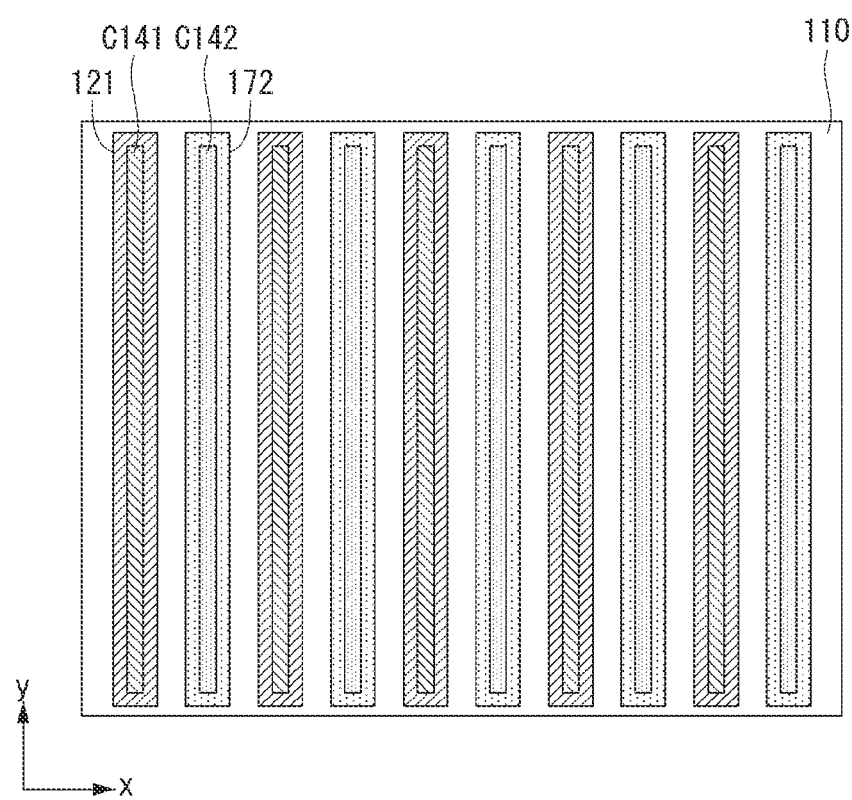
Figure 4:
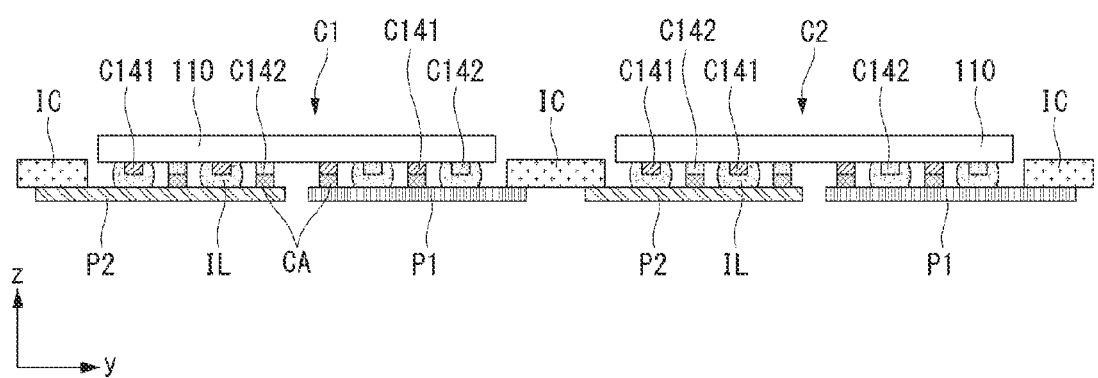
Figure 5:
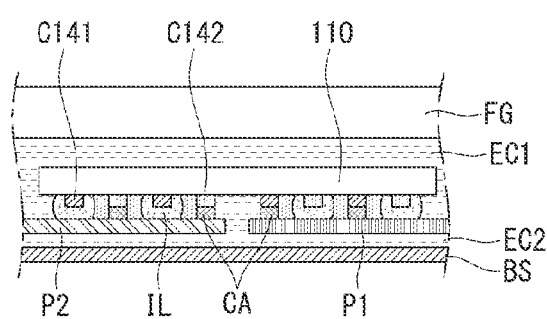

More specifically, FIG. 1 shows a structure of a back surface of the first example of the solar cell module according to the embodiment of the invention. FIG. 2 is a partial perspective view showing an example of a solar cell applied to the solar cell module shown in FIG. 1. FIG. 3 shows a back pattern of first and second electrodes of the solar cell shown in FIG. 2. FIG. 4 is a cross-sectional view taken along line cx1-cx1 of FIG. 1. FIG. 5 is a cross-sectional view of a string formed by connecting a plurality of solar cells shown in FIGS. 1 and 4 in series.

As shown in FIG. 1, the first example of the solar cell module according to the embodiment of the invention includes a plurality of solar cells C1 and C2, a plurality of first and second conductive lines P1 and P2 connected to each of the plurality of solar cells C1 and C2, and interconnectors IC for connecting the plurality of first and second conductive lines P1 and P2.

The plurality of solar cells C1 and C2 may be connected in series to each other in a first direction x through the first and second conductive lines P1 and P2 and the interconnectors IC and thus may form a string.

In the embodiment disclosed herein, each of the plurality of solar cells C1 and C2 may include a semiconductor substrate 110 and a plurality of first and second electrodes C141 and C142 formed on a back surface of the semiconductor substrate 110. The plurality of first conductive lines P1 may be connected to the plurality of first electrodes C141, and the plurality of second conductive lines P2 may be connected to the plurality of second electrodes C142.

In other words, each solar cell may indispensably include the semiconductor substrate 110 and the plurality of first and second electrodes C141 and C142 that are formed on the back surface of the semiconductor substrate 110 and are separated from each other.

More specifically, as shown in FIGS. 2 and 3, an example of the solar cell according to the embodiment of the invention may include a semiconductor substrate 110, an anti-reflection layer 130, a plurality of emitter regions 121, a plurality of back surface field regions 172, a plurality of first electrodes C141, and a plurality of second electrodes C142.

The anti-reflection layer 130 and the back surface field regions 172 may be omitted in the embodiment of the invention, if necessary or desired. In the following description, the embodiment of the invention is described using the solar cell including the anti-reflection layer 130 and the back surface field regions 172 as an example.

The semiconductor substrate 110 may be a semiconductor substrate formed of silicon of a first conductive type, for example, an n-type, though not required. The semiconductor substrate 110 may be formed by doping a semiconductor wafer formed of crystalline silicon material with impurities of the first conductive type, for example, the n-type.

The plurality of emitter regions 121 may be separated from one another inside a back surface opposite a front surface of the semiconductor substrate 110 and may extend in a second direction y crossing the first direction x. The plurality of emitter regions 121 may contain impurities of a second conductive type (for example, p-type) opposite the first conductive type (for example, n-type) of the semiconductor substrate 110.

Hence, a p-n junction may be formed by the semiconductor substrate 110 and the emitter region 121.

The plurality of back surface field regions 172 may be positioned inside the back surface of the semiconductor substrate 110 and may be separated from one another. The plurality of back surface field regions 172 may extend in the second direction y parallel to the plurality of emitter regions 121. Thus, as shown in FIGS. 2 and 3, the plurality of emitter regions 121 and the plurality of back surface field regions 172 may be alternately positioned at the back surface of the semiconductor substrate 110.

Each back surface field region 172 may be a region (for example, an $n^{++}$-type region) that is more heavily doped than the semiconductor substrate 110 with impurities of the same conductive type as the semiconductor substrate 110.

The emitter regions 121 and the back surface field regions 172 are not shown in FIGS. 1 and 4 for the sake of brevity and ease of reading.

The plurality of first electrodes C141 may be physically and electrically connected to the plurality of emitter regions 121, respectively and may be formed on the back surface of the semiconductor substrate 110 along the emitter regions 121.

The plurality of second electrodes C142 may be formed on the back surface of the semiconductor substrate 110 along the plurality of back surface field regions 172 and may be physically and electrically connected to the semiconductor substrate 110 through the plurality of back surface field regions 172.

As shown in FIG. 3, the plurality of first electrodes C141 may extend in the second direction y and may be separated from one another in the first direction x crossing the second direction y.

Further, as shown in FIG. 3, the plurality of second electrodes C142 may extend in the second direction y and may be separated from one another in the first direction x crossing the second direction y.

The plurality of first and second electrodes C141 and C142 may be separated from each other and may be alternately disposed.

In the embodiment of the invention, a ratio of a thickness TC to a width WC of each of the plurality of first and second electrodes C141 and C142 may be 1:200 to 1:1500. For example, the thickness TC of each of the plurality of first and second electrodes C141 and C142 may be 0.2 μm to 1 μm, and the width WC of each of the plurality of first and second electrodes C141 and C142 may be 200 μm to 300 μm.

As described above, when the ratio of the thickness TC to the width WC of each of the first and second electrodes C141 and C142 is 1:200 to 1:1500, the manufacturing cost of the solar cell may be minimized.

In this instance, a cross-sectional area of each of the first and second electrodes C141 and C142 may excessively decrease, and thus a resistance of each of the first and second electrodes C141 and C142 may be a problem. However, the resistance of the electrode may be solved by properly setting the number and a width of each of the first and second conductive lines P1 and P2 respectively connected to the first and second electrodes C141 and C142. The plurality of first and second electrodes C141 and C142 may be manufactured through a sputtering method, for example.

In the solar cell having the above-described structure according to the embodiment of the invention, holes collected by the first electrodes C141 and electrons collected by the second electrodes C142 may be used as electric power of an external device through an external circuit device.

The solar cell applied to the solar cell module according to the embodiment of the invention is not limited to FIGS. 2 and 3. The components of the solar cell may vary, except that the first and second electrodes C141 and C142 included in the solar cell are formed on the back surface of the semiconductor substrate 110.

For example, the solar cell module according to the embodiment of the invention may use a metal wrap through (MWT) solar cell, that is configured such that a portion of the first electrode C141 and the emitter region 121 are positioned on the front surface of the semiconductor substrate 110, and the portion of the first electrode C141 is connected to a remaining portion of the first electrode C141 formed on the back surface of the semiconductor substrate 110 through a hole of the semiconductor substrate 110.

As shown in FIGS. 1 and 4, the plurality of solar cells may be arranged in the first direction x. A longitudinal direction of the first and second electrodes C141 and C142 included in the first and second solar cells C1 and C2 may face toward the second direction y.

FIGS. 1 to 3 show that the plurality of first and second electrodes C141 and C142 are arranged in the form of a stripe in the second direction y, as an example. On the contrary, each of the plurality of first and second electrodes C141 and C142 may extend in the second direction y, but may have an intermittently cut shape.

Namely, unlike FIG. 1, the first and second electrodes C141 and C142 may not be formed in a formation portion of an insulating layer IL in each of the first and second electrodes C141 and C142. In other words, the plurality of first electrodes C141 may extend in the second direction y and may not be formed at crossings of the plurality of first electrodes C141 and the plurality of second conductive lines P2. Namely, a portion of the first electrode C141 may be separated from another portion of the first electrode C141 at the crossing.

Further, the plurality of second electrodes C142 may extend in the second direction y and may not be formed at crossings of the plurality of second electrodes C142 and the plurality of first conductive lines P1. Namely, a portion of the second electrode C142 may be separated from another portion of the second electrode C142 at the crossing.

As shown in FIG. 1, the plurality of first and second conductive lines P1 and P2 may extend in the first direction x crossing the first and second electrodes C141 and C142.

Each of the first and second conductive lines P1 and P2 may use a conductive wire or a conductive ribbon, which includes a core containing at least one of copper (Cu), gold (Au), silver (Ag), and aluminum (Al) and a coating layer coated on the surface of the core with a solder material containing tin (Sn) and has a stripe shape extending in one direction.

As shown in FIGS. 1 and 4, the plurality of first and second conductive lines P1 and P2 may be connected to the plurality of first and second electrodes C141 and C142 of each solar cell using a conductive adhesive CA.

More specifically, as shown in FIGS. 1 and 4, in each of the first and second solar cells C1 and C2, the plurality of first conductive lines P1 may be connected to the plurality of first electrodes C141 at crossings of the plurality of first electrodes C141 and the plurality of first conductive lines P1 using the conductive adhesive CA, and the plurality of second conductive lines P2 may be connected to the plurality of second electrodes C142 at crossings of the plurality of second electrodes C142 and the plurality of second conductive lines P2 using the conductive adhesive CA.

The conductive adhesive CA may use a solder paste including at least a metal material, for example, tin (Sn), a conductive paste including at least a metal material, for example, tin (Sn) in at least one of epoxy resin or silicon resin, or a conductive film.

As shown in FIGS. 1 and 4, the conductive adhesive CA may be positioned between the first electrode C141 and the first conductive line P1 at each crossing of the plurality of first electrodes C141 and the plurality of first conductive lines P1, or may be positioned between the second electrode C142 and the second conductive line P2 at each crossing of the plurality of second electrodes C142 and the plurality of second conductive lines P2.

In each of the first and second solar cells C1 and C2, the plurality of first conductive lines P1 may be insulated from the plurality of second electrodes C142 at the crossings of the plurality of second electrodes C142 and the plurality of first conductive lines P1 through the insulating layer IL, and the plurality of second conductive lines P2 may be insulated from the plurality of first electrodes C141 at the crossings of the plurality of first electrodes C141 and the plurality of second conductive lines P2 through the insulating layer IL.

In the embodiment disclosed herein, a material of the insulating layer IL is not particularly limited as long as it is an insulating material. For example, epoxy-based or silicon-based insulating resin may be used for the insulating layer IL.

As shown in FIG. 1, in the first example of the solar cell module according to the embodiment of the invention, each of the first and second conductive lines P1 and P2 may overlap the semiconductor substrate 110 of each solar cell. Further, an end of each of the first and second conductive lines P1 and P2 may protrude further than the semiconductor substrate 110.

Accordingly, the ends of the plurality of first and second conductive lines P1 and P2 may be separately connected to the interconnector IC so as to form the string, when viewing the semiconductor substrates 110 of the first and second solar cells C1 and C2 from their back surface. In FIG. 4, the plurality of first and second conductive lines P1 and P2 may be connected to the interconnector IC using the conductive adhesive CA.

More specifically, as shown in FIG. 1, the end of the first conductive line P1 protruding to the outside of the semiconductor substrate 110 of the first solar cell C1 and the end of the second conductive line P2 protruding to the outside of the semiconductor substrate 110 of the second solar cell C2 may be connected to the interconnector IC positioned between the first and second solar cells C1 and C2.

As shown in FIGS. 1 and 4, the first conductive line P1 of the first solar cell C1 and the second conductive line P2 of the second solar cell C2 may be connected to a back surface of the interconnector IC.

In the embodiment disclosed herein, the first solar cell C1 may be one of the plurality of solar cells, and the second solar cell C2 may be a solar cell adjacent to the first solar cell C1.

As shown in FIGS. 1 and 4, the interconnector IC may extend in the second direction y that crosses a longitudinal direction of the first and second conductive lines P1 and P2 and is the same as a longitudinal direction of the first and second electrodes C141 and C142 of each solar cell. In the embodiment disclosed herein, the interconnector IC may be formed of a metal pad.

Hence, the plurality of solar cells C1 and C2 arranged in the first direction x may be connected in series to each other through the first and second conductive lines P1 and P2 to form one string.

As shown in FIG. 5, the string formed by connecting the plurality of solar cells shown in FIGS. 1 and 4 in series may be configured as a module.

More specifically, as shown in FIG. 5, a lamination process for thermal pressurization may be performed in a state where the plurality of solar cells connected in series through the first and second conductive lines P1 and P2 are positioned on a first encapsulant EC1 applied to a front transparent substrate FG and then a second encapsulant EC2 and a back sheet BS are disposed on the plurality of solar cells, thereby configuring a module. A thermal temperature in the lamination process may be about 145° C. to 170° C.

The front transparent substrate FG may be formed of glass material with light transmission or plastic material with light transmission. The first and second encapsulants EC1 and EC2 may be formed of a material with elasticity and insulation, for example, ethylene vinyl acetate (EVA). Further, the back sheet BS may be formed of an insulating material having a moisture-proof function.

So far, the embodiment of the invention described the solar cell module, in which each of the first and second conductive lines P1 and P2 overlaps only one solar cell or only one semiconductor substrate 110, is connected to the back surface of each solar cell, and is separately connected to the interconnector IC.

On the contrary, the separate interconnector IC shown in FIG. 1 may be omitted, and each of the first and second conductive lines P1 and P2 may overlap and may be connected to the two solar cells or the two semiconductor substrates 110, thereby serving as the interconnector.

A second example of the solar cell module manufactured in accordance with one example embodiment of the invention is described below.

Figure 6:
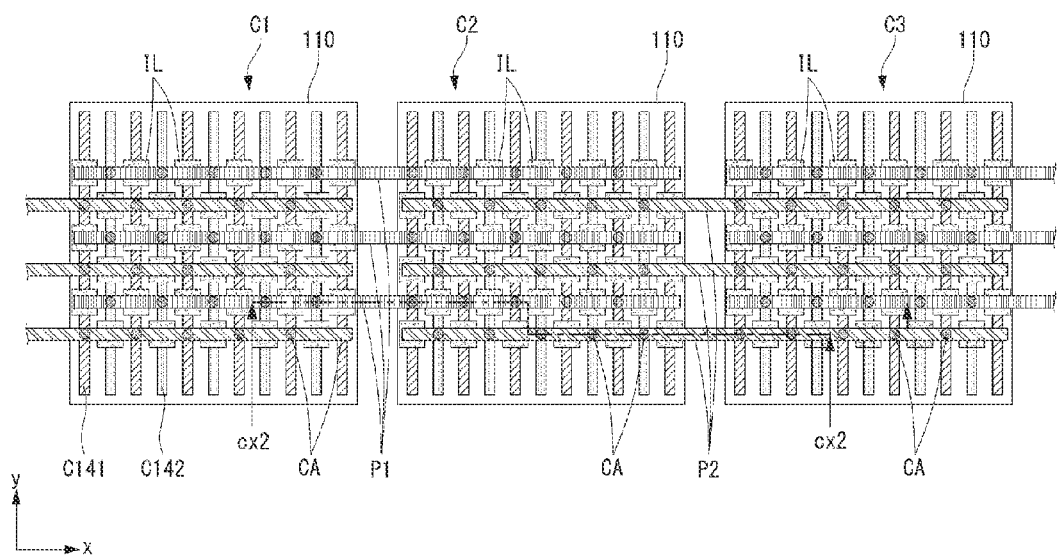
FIGS. 6 and 7 illustrate a second example of a solar cell module manufactured in accordance with one example embodiment of the invention.
Figure 7:
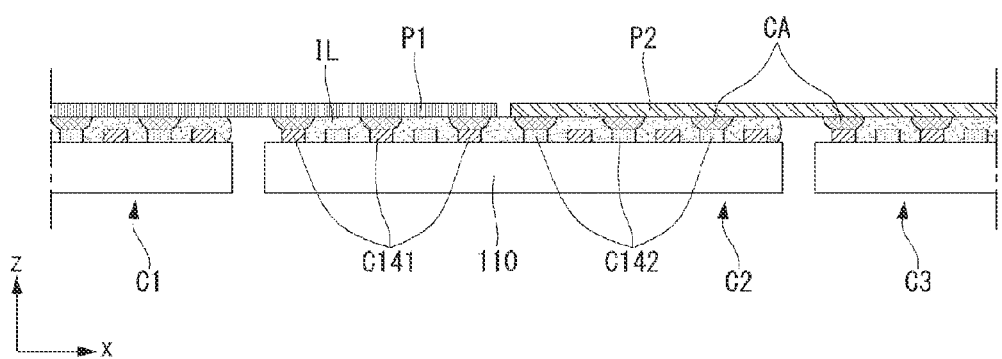

FIGS. 6 and 7 illustrate a second example of the solar cell module manufactured in accordance with one example embodiment of the invention.

More specifically, FIG. 6 shows a structure of a back surface of the second example of the solar cell module according to the embodiment of the invention, and FIG. 7 is a cross-sectional view taken along line cx2-cx2 of FIG. 6.

The description of structures and components identical or equivalent to those described in the first example of the solar cell module according to the embodiment of the invention is omitted in FIGS. 6 and 7, and a difference therebetween is mainly described.

The second example of the solar cell module shown in FIGS. 6 and 7 may use the same solar cell, a conductive adhesive CA formed of the same material, an insulating layer IL formed of the same material, and first and second conductive lines P1 and P2 formed of the same material in the same direction as the first example of the solar cell module.

In the second example of the solar cell module, a length of each of the first and second conductive lines P1 and P2 may be longer than a length of each of the first and second conductive lines P1 and P2 in the first example of the solar cell module.

Accordingly, in the second example of the solar cell module according to the embodiment of the invention, the first and second conductive lines P1 and P2 may overlap two semiconductor substrates 110 of two adjacent solar cells.

In the embodiment of the invention, the plurality of solar cells may be connected in series to one another through the plurality of first and second conductive lines P1 and P2 extending in the first direction x. For this, each of the plurality of first and second conductive lines P1 and P2 may be connected to the plurality of first electrodes C141 included in one of the plurality of solar cells and the plurality of second electrodes C142 included in another solar cell adjacent to the one solar cell.

For example, as shown in FIGS. 6 and 7, a plurality of solar cells C1 to C3 may be sequentially arranged in the first direction x, the first and second solar cells C1 and C2 may be adjacent to each other, and the second and third solar cells C2 and C3 may be adjacent to each other. In this instance, the first conductive line P1 connected to first electrodes C141 of the second solar cell C2 may be connected to second electrodes C142 of the first solar cell C1 using the conductive adhesive CA.

Further, the second conductive line P2 connected to second electrodes C142 of the second solar cell C2 may be connected to first electrodes C141 of the third solar cell C3 using the conductive adhesive CA.

The insulating layer IL may be positioned between the plurality of first conductive lines P1 and the plurality of second electrodes C142 of one solar cell (for example, the second solar cell C2) and between the plurality of first conductive lines P1 and the plurality of first electrodes C141 of another solar cell (for example, the first solar cell C1) adjacent to the one solar cell, thereby insulating them.

Accordingly, as described above, the second example of the solar cell module according to the embodiment of the invention individually described the first and second conductive lines P1 and P2 using the second solar cell C2 as an example. However, each of the first and second conductive lines P1 and P2 may be connected to the first electrodes C141 or the second electrodes C142 of one solar cell and the second electrodes C142 or the first electrodes C141 of another solar cell adjacent to the one solar cell. Therefore, the discrimination of the first and second conductive lines P1 and P2 may be unnecessary in the second example of the solar cell module according to the embodiment of the invention. Further, the first and second conductive lines P1 and P2 may serve as the interconnector for connecting the adjacent solar cells in series. In this instance, the interconnector may be omitted.

As shown in FIG. 6, a formation area of the insulating layer IL may be different from a formation area of the conductive adhesive CA at the back surface of the semiconductor substrate 110. More specifically, even if there is an error in the alignment of the first and second conductive lines P1 and P2, the formation area of the insulating layer IL may be greater than the formation area of the conductive adhesive CA at the back surface of the semiconductor substrate 110 so as to surely prevent the undesired short circuit between the first and second conductive lines P1 and P2 and the first and second electrodes C141 and C142.

The configuration, in which the formation area of the insulating layer IL is different from the formation area of the conductive adhesive CA at the back surface of the semiconductor substrate 110 in the second example of the solar cell module according to the embodiment of the invention, may be equally applied to the solar cell module shown in FIG. 1.

So far, the first and second examples of the solar cell module according to the embodiment of the invention described that the plurality of conductive wires or the plurality of conductive ribbons are used as the first and second conductive lines P1 and P2, as an example. On the contrary, the first and second conductive lines P1 and P2 may be connected to the plurality of solar cells in a state where the first and second conductive lines P1 and P2 are previously patterned on an insulating member. This is described below.

FIGS. 8 to 14C illustrate a third example of the solar cell module manufactured in accordance with one example embodiment of the invention.

The description of structures and components identical or equivalent to those described in the first and second examples of the solar cell module according to the embodiment of the invention is omitted in FIGS. 8 to 14C, and a difference therebetween is mainly described.

Figure 8:
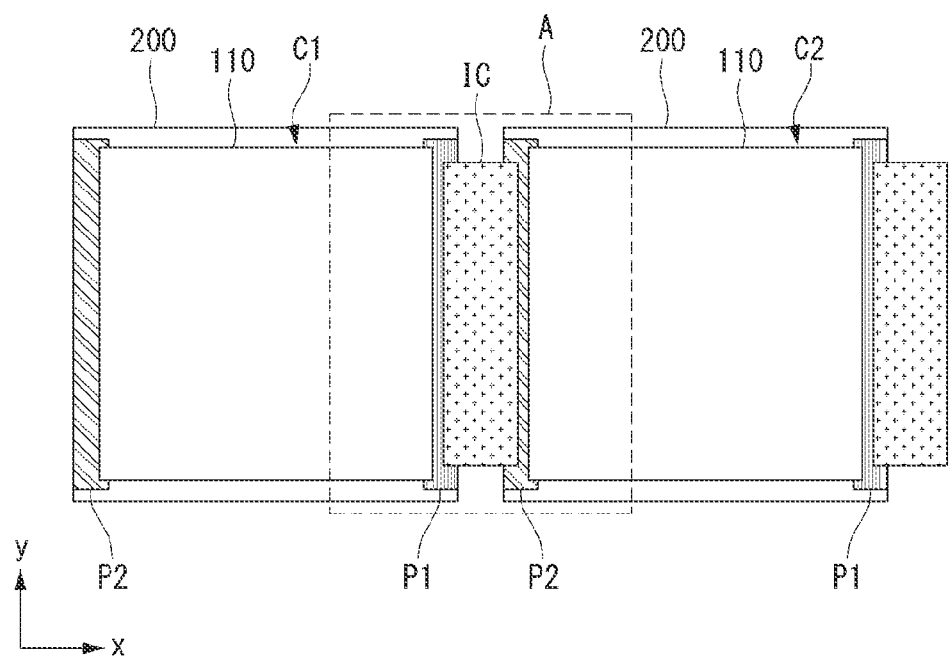
FIGS. 8 to 14C illustrate a third example of a solar cell module manufactured in accordance with one example embodiment of the invention.
Figure 9:
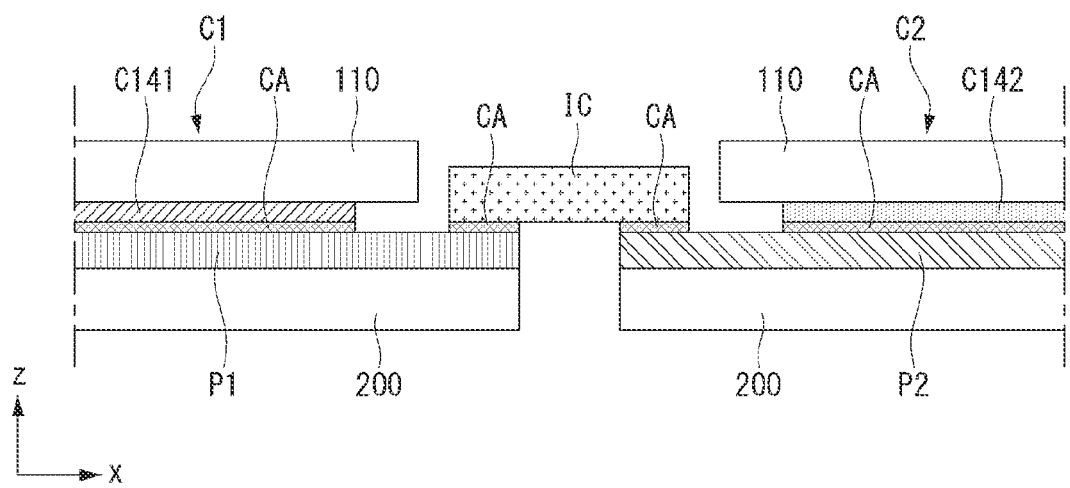

FIG. 8 shows that a plurality of solar cells included in the solar cell module according to the embodiment of the invention are connected to an interconnector when viewed from a front surface, and FIG. 9 is a cross-sectional view of an area A of FIG. 8.

As shown in FIGS. 8 and 9, the third example of the solar cell module according to the embodiment of the invention may include first and second solar cells C1 and C2, first and second conductive lines P1 and P2, an insulating member 200, and an interconnector IC.

Each of the first and second solar cells C1 and C2 may be formed as an individual integrated type solar cell element by connecting each insulating member 200, on which the first and second conductive lines P1 and P2 are formed, to each semiconductor substrate 110, on which a plurality of first and second electrodes C141 and C142 are formed. However, the embodiment of the invention is not limited thereto. Only the insulating member 200 may be omitted in the individual integrated type solar cell element.

The semiconductor substrate 110 may have the same structure as the first and second examples of the solar cell module according to the embodiment of the invention, but each solar cell may be configured so that a longitudinal direction of the first and second electrodes C141 and C142 of each solar cell is not the second direction y but the first direction x. This is described in detail later.

The insulating member 200 may include the first conductive line P1 connected to the plurality of first electrodes C141 and the second conductive line P2 connected to the plurality of second electrodes C142.

As shown in FIG. 9, the first and second conductive lines P1 and P2 may be respectively connected to the first and second electrodes C141 and C142 of each solar cell using a conductive adhesive CA.

Thus, the first and second conductive lines P1 and P2 are previously patterned on one insulating member 200. Hence, each insulating member 200 including the first and second conductive lines P1 and P2 and each semiconductor substrate 110, on which the first and second electrodes C141 and C142 are formed, are connected to each other, thereby forming the individual element.

The interconnector IC may be substantially the same as the first and second examples of the solar cell module according to the embodiment of the invention. Thus, as shown in FIG. 8, the adjacent first and second solar cells C1 and C2 may be connected in series to each other in the first direction x through the interconnector IC.

More specifically, for example, as shown in FIG. 9, both ends of the interconnector IC may be respectively connected to the first conductive line P1 of the first solar cell C1 and the second conductive line P2 of the second solar cell C2. On the contrary, both ends of the interconnector IC may be respectively connected to the second conductive line P2 of the first solar cell C1 and the first conductive line P1 of the second solar cell C2.

In this instance, the connection between the interconnector IC and the first conductive line P1 and the connection between the interconnector IC and the second conductive line P2 may be performed using the conductive adhesive CA formed of a conductive material.

The first and second solar cells C1 and C2 are described in detail below.

Figure 10:
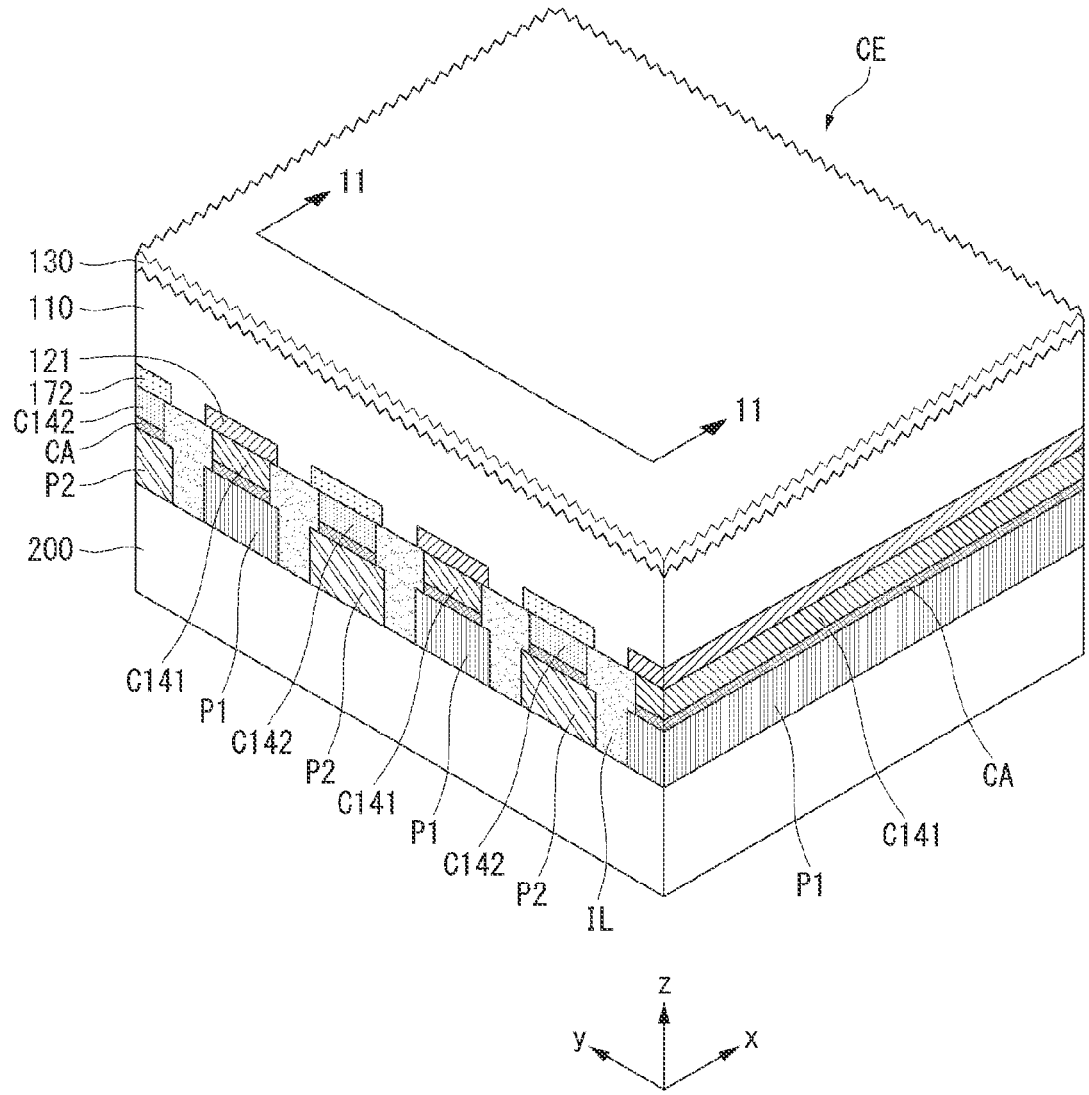
Figure 11:
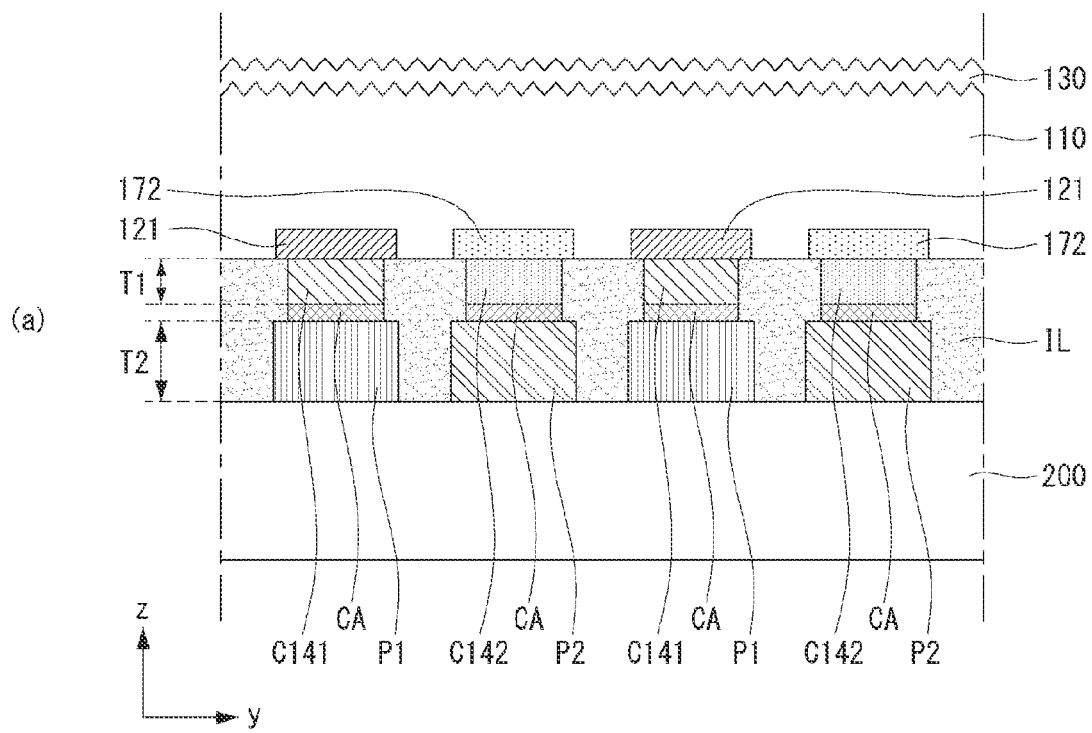
Figure 11:
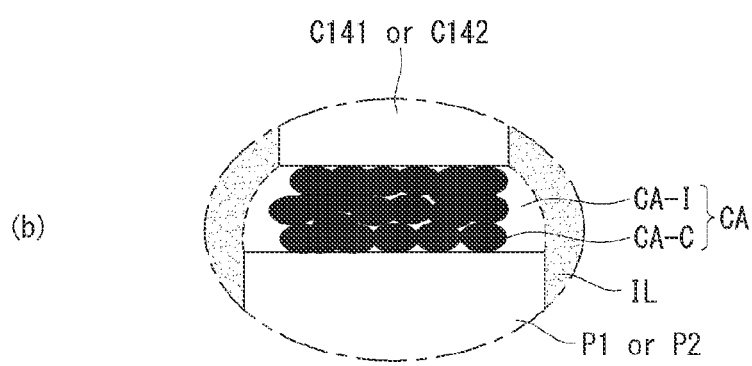

FIGS. 10 and 11 show that each semiconductor substrate 110, on which the first and second electrodes C141 and C142 are formed, and each insulating member 200, on which the first and second conductive lines P1 and P2 are formed, are connected to each other to form an individual integrated type solar cell element, in the same manner as FIG. 8. More specifically, FIG. 10 is a partial perspective view of an individual integrated type solar cell element according to the embodiment of the invention, and (a) of FIG. 11 is a cross-sectional view taken along line 11-11 of FIG. 10.

Figure 12:
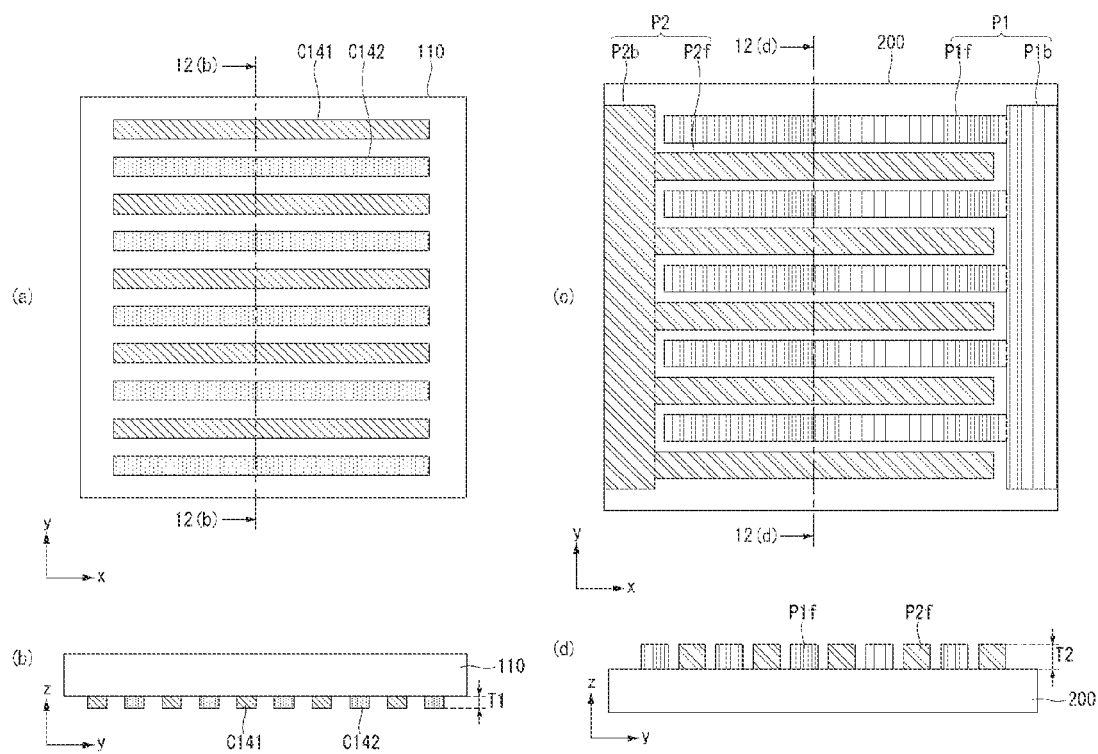

FIG. 12 shows an example of a pattern of the first and second electrodes C141 and C142 formed on the semiconductor substrate 110 and a pattern of the first and second conductive lines P1 and P2 the insulating member 200 in the solar cell shown in FIGS. 10 and 11.

In FIG. 12, (a) shows an example of a pattern of the first and second electrodes C141 and C142 disposed on a back surface of the semiconductor substrate 110; (b) is a cross-sectional view taken along line 12(b)-12(b) of (a) of FIG. 12; (c) shows an example of a pattern of the first and second conductive lines P1 and P2 disposed on a front surface of the insulating member 200; and (d) is a cross-sectional view taken along line 12(d)-12(d) of (c) of FIG. 12.

As shown in FIGS. 10 and 11, an example of the individual integrated type solar cell element according to the embodiment of the invention may include an insulating member 200 that is individually connected to a back surface of each solar cell, in a state where a solar cell including a semiconductor substrate 110, an anti-reflection layer 130, an emitter region 121, a back surface field region 172, a plurality of first electrodes C141, and a plurality of second electrodes C142 and first and second conductive lines P1 and P2 are formed.

The structure of the solar cell in the third example of the solar cell module according to the embodiment of the invention may be almost the same as the first and second examples.

In the third example of the solar cell module according to the embodiment of the invention, a longitudinal direction of the first and second electrodes C141 and C142 may be the first direction x. Therefore, unlike the first and second examples of the solar cell module according to the embodiment of the invention, a longitudinal direction of each of the emitter region 121, the back surface field region 172, and the first and second electrodes C141 and C142 of each solar cell may be the first direction x.

Since the remaining structure of the solar cell in the third example of the solar cell module according to the embodiment of the invention is substantially the same as the first and second examples, a further description may be briefly made or may be entirely omitted.

As shown in (c) of FIG. 12, the first and second conductive lines P1 and P2 may be patterned and previously formed on a front surface of the insulating member 200.

As shown in (c) of FIG. 12, the first conductive line P1 may include a first connector P1f and a first pad P1b, and the second conductive line P2 may include a second connector P2f and a second pad P2b.

The first and second conductive lines P1 and P2 may be formed of at least one of copper (Cu), gold (Au), silver (Ag), and aluminum (Al).

As shown in (a) of FIG. 11, the first conductive line P1 may be electrically connected to the first electrodes C141 using the conductive adhesive CA formed of a conductive material, and the second conductive line P2 may be electrically connected to the second electrodes C142 using the conductive adhesive CA formed of the conductive material.

An insulating layer IL preventing short circuit may be positioned between the first and second electrodes C141 and C142 and between the first and second conductive lines P1 and P2.

The materials of the conductive adhesive CA and the insulating layer IL in the third example of the solar cell module according to the embodiment of the invention may be the same as the first and second examples of the solar cell module according to the embodiment of the invention.

A material of the insulating member 200 is not particularly limited as long as it is an insulating material. However, it may be preferable, but not required, that a melting point of the material of the insulating member 200 is relatively high. For example, the insulating member 200 may be formed of at least one of polyimide, epoxy-glass, polyester, or bismaleimide triazine (BT) resin, each of which has a thermal resistance to a high temperature.

The insulating member 200 may be formed in the form of a flexible film or in the form of a hard plate that is not flexible.

Each insulating member 200 and each semiconductor substrate 110 may be connected to each other to form the individual integrated type solar cell element in a state where the first and second conductive lines P1 and P2 are previously formed on the front surface of the insulating member 200 and the first and second electrodes C141 and C142 are previously formed on the back surface of the semiconductor substrate 110.

Namely, only one semiconductor substrate 110 may be attached and connected to one insulating member 200. In other words, the first and second electrodes C141 and C142 formed on the back surface of one semiconductor substrate 110 may be respectively connected to the first and second conductive lines P1 and P2 formed on the front surface of one insulating member 200 through the conductive adhesive CA, thereby forming the individual integrated type solar cell element.

In the individual integrated type solar cell element according to the embodiment of the invention, a thickness T2 of each of the first conductive line P1 and the second conductive line P2 may be greater than a thickness T1 of each of the first electrode C141 and the second electrode C142.

The insulating member 200 functions to facilitate the process performed when the first and second conductive lines P1 and P2 are respectively attached to the first and second electrodes C141 and C142 formed on the back surface of the semiconductor substrate 110.

Namely, when the front surface of the insulating member 200, on which the first and second conductive lines P1 and P2 are formed, is attached and connected to the back surface of the semiconductor substrate 110, on which the first and second electrodes C141 and C142 are formed, through a semiconductor manufacturing process, the insulating member 200 may help in more easily performing an alignment process or a connection process.

Thus, after the first and second conductive lines P1 and P2 are respectively connected to the first and second electrodes C141 and C142 through the connection process, the insulating member 200 may be removed.

Thus, the insulating member 200 may be omitted in the completed individual integrated type solar cell element. In the following description, the embodiment of the invention is described using the individual integrated type solar cell element including the insulating member 200 as an example.

In the individual integrated type solar cell element having the above-described structure according to the embodiment of the invention, holes collected through the first conductive lines P1 and electrons collected through the second conductive lines P2 may be used as currents for electric power of an external device through an external circuit device.

So far, the embodiment of the invention described that the semiconductor substrate 110 is the crystalline silicon semiconductor substrate, and the emitter region 121 and the back surface field region 172 are formed through a diffusion process, as an example.

On the contrary, the embodiment of the invention may be equally applied to a heterojunction solar cell configured such that an emitter region and a back surface field region, each of which is formed of amorphous silicon, are formed on a crystalline silicon semiconductor substrate, or a solar cell configured such that an emitter region is formed on a front surface of a semiconductor substrate and is connected to a first electrode formed on a back surface of the semiconductor substrate through a plurality of via holes of the semiconductor substrate.

The plurality of individual integrated type solar cell elements each having the above-described structure may be connected in series to one another through the interconnector IC.

In the individual integrated type solar cell element having the above-described structure, a pattern of the first and second electrodes C141 and C142 formed on the back surface of the semiconductor substrate 110 and a pattern of the first and second conductive lines P1 and P2 formed on the front surface of the insulating member 200 are described in detail below.

The front surface of the insulating member 200 having the structure shown in (c) and (d) of FIG. 12 may be attached and connected to the back surface of the semiconductor substrate 110 having the structure shown in (a) and (b) of FIG. 12, thereby forming the individual integrated type solar cell element. Namely, the insulating member 200 and the semiconductor substrate 110 may have one-to-one connection.

In this instance, as shown in (a) and (b) of FIG. 12, the plurality of first electrodes C141 and the plurality of second electrodes C142 may be separated from each other on the back surface of the semiconductor substrate 110 and may extend in the first direction x.

Further, as shown in (c) and (d) of FIG. 12, the first conductive line P1 and the second conductive line P2 may be formed on the front surface of the insulating member 200.

As described above, the first conductive line P1 may include the first connector P1f and the first pad P1b as shown in (c) of FIG. 12.

The first connector P1f may be in the plural and may extend in the first direction x that is the same as the longitudinal direction of the first electrode C141. Hence, the plurality of first connectors P1f may be respectively connected to the plurality of first electrodes C141 using the conductive adhesive CA.

As shown in (c) of FIG. 12, the first pad P1b may extend in the second direction y. One side of the first pad P1b may be connected to ends of the first connectors P1f, and the other side may be connected to the interconnector IC.

Further, as shown in (c) of FIG. 12, the second conductive line P2 may include the second connector P2f and the second pad P2b.

The second connector P2f may be in the plural and may extend in the first direction x that is the same as the longitudinal direction of the second electrode C142. Hence, the plurality of second connectors P2f may be respectively connected to the plurality of second electrodes C142 using the conductive adhesive CA.

As shown in (c) of FIG. 12, the second pad P2b may extend in the second direction y. One side of the second pad P2b may be connected to ends of the second connectors P2f, and the other side may be connected to the interconnector IC.

In the embodiment disclosed herein, the first connectors P2f may be separated from the second pad P2b, and the second connectors P2f may be separated from the first pad P1b.

Accordingly, the first pad P1b may be formed at one end of the front surface of the insulating member 200 in the first direction x, and the second pad P2b may be formed at the other end of the insulating member 200.

Further, each of the first and second connectors P1f and P2f is not in the plural and may be configured as one sheet electrode. In this instance, the plurality of first electrodes C141 may be connected to the sheet electrode type first connector P1f, and the plurality of second electrodes C142 may be connected to the sheet electrode type second connector P2f.

FIG. 12 shows that the longitudinal direction of the first electrode C141 is the same as the longitudinal direction of the first connector P1f of the first conductive line P1, and the longitudinal direction of the second electrode C142 is the same as the longitudinal direction of the second connector P2f of the second conductive line P2. However, if the solar cell is configured so that the longitudinal direction of the first and second electrodes C141 and C142 is the second direction y, the first and second connectors P1f and P2f may be arranged in the direction crossing the longitudinal direction of the first and second electrodes C141 and C142. In this instance, the first and second connectors P1f and P2f may be electrically connected to the first and second electrodes C141 and C142 at crossings therebetween using the conductive adhesive.

Further, in this instance, the first electrode C141 may overlap the second connector P2f, and the second electrode C142 may overlap the first connector P1f. The insulating layer IL for preventing the short circuit may be positioned between the first electrode C141 and the second connector P2f and between the second electrode C142 and the first connector P1f.

As described above, the individual integrated type solar cell element according to the embodiment of the invention may be formed by attaching and connecting only one insulating member 200 to one semiconductor substrate 110, thereby more easily performing a manufacturing process of the solar cell module. Further, even if one solar cell element is broken or damaged in the manufacturing process of the solar cell module, only the broken or damaged solar cell element may be replaced. Hence, the process yield of the solar cell module may be further improved.

When an area of the insulating member 200 is equal to or greater than an area of the semiconductor substrate 110, a formation space of the interconnector IC for connecting the adjacent solar cell elements in series may be sufficiently secured in the front surface of the insulating member 200. Thus, the area of the insulating member 200 may be greater than the area of the semiconductor substrate 110.

For this, a length of the insulating member 200 in the first direction x may be longer than a length of the semiconductor substrate 110 in the first direction x.

In the embodiment of the invention, the front surface of the insulating member 200 may be attached to the back surface of the semiconductor substrate 110. Hence, the first electrodes C141 may be connected to the first conductive line P1, and the second electrodes C142 may be connected to the second conductive line P2.

Figure 13:
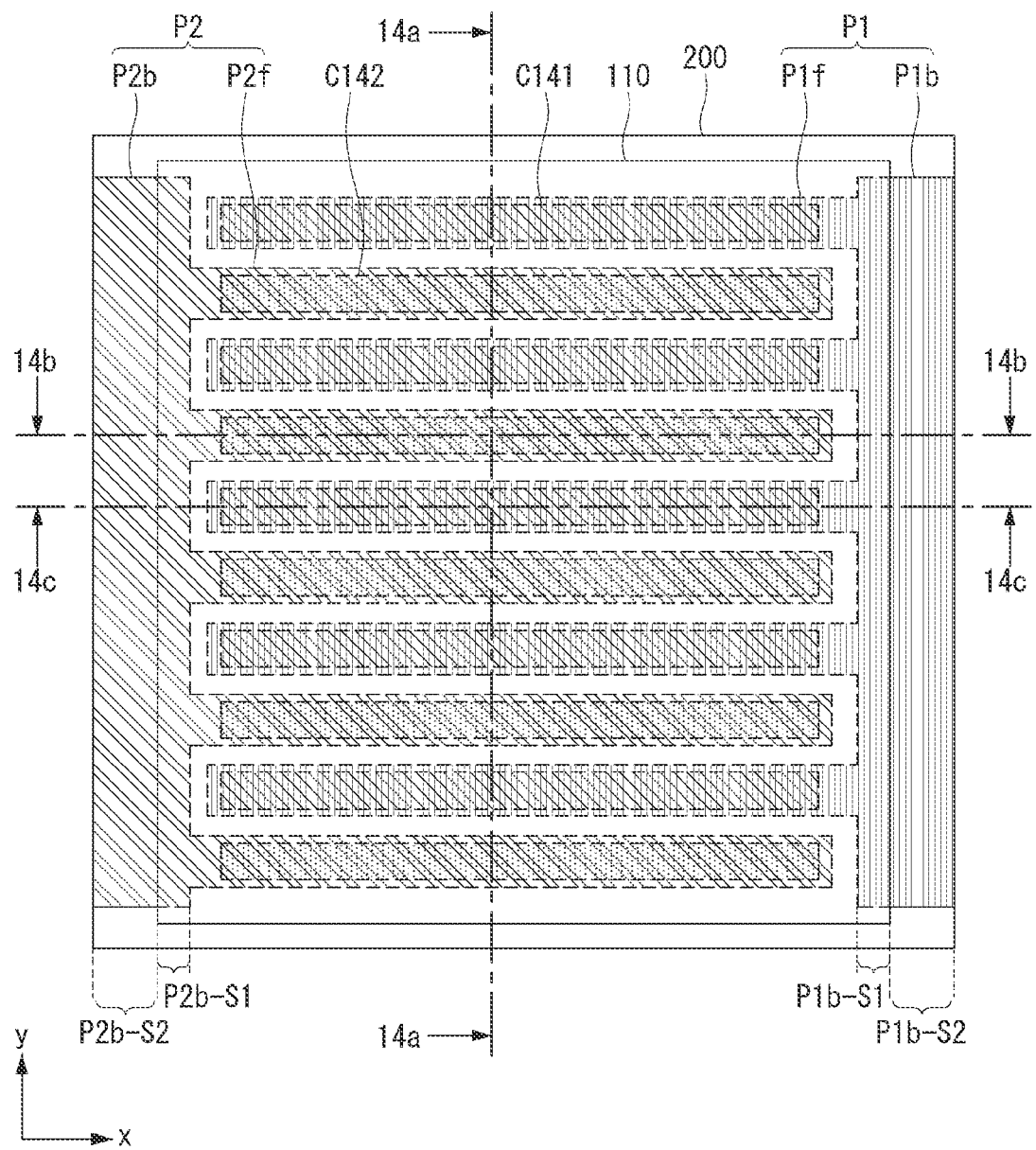
Figure 14A:
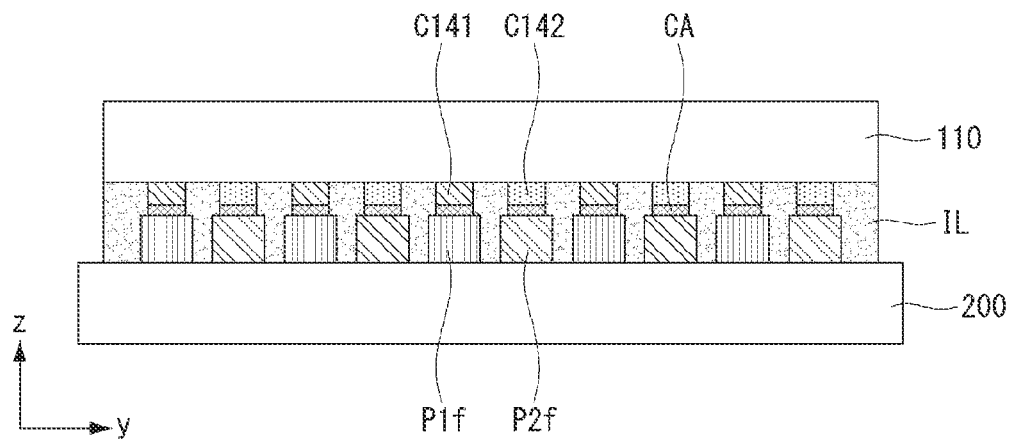
Figure 14B:
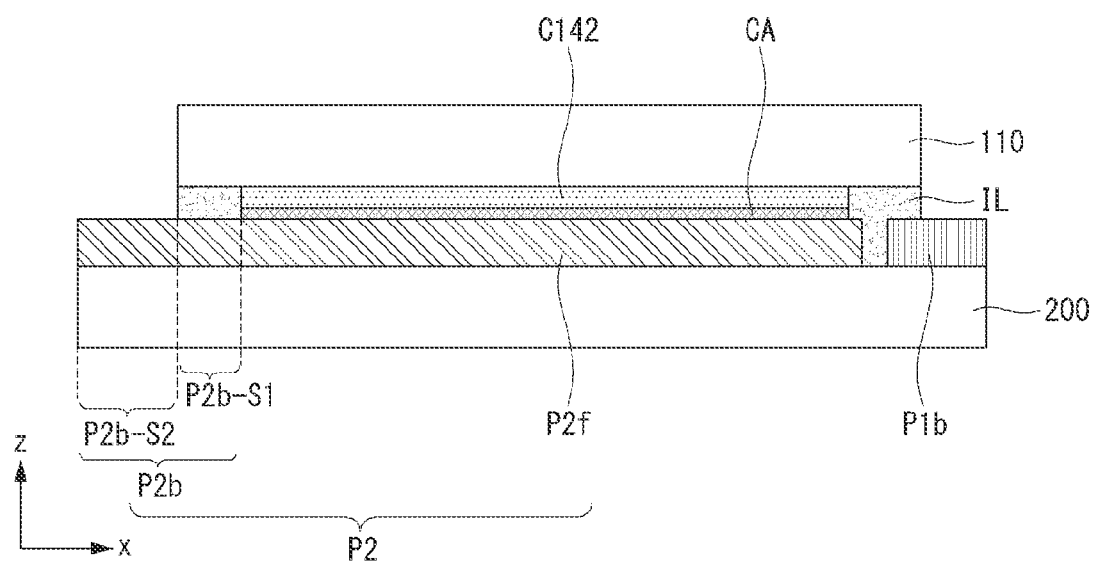
Figure 14C:
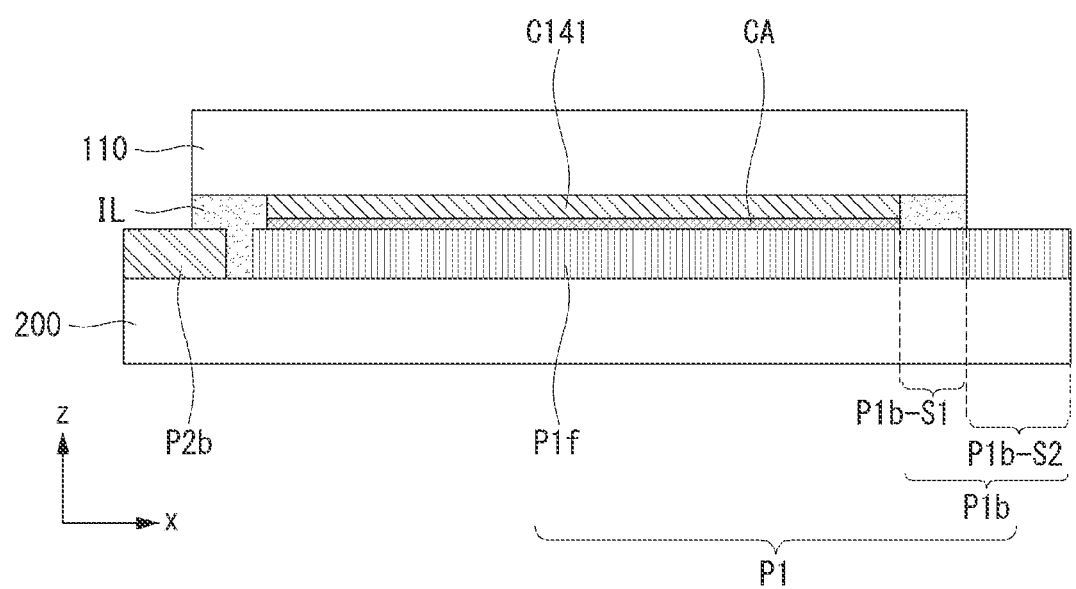

FIG. 13 shows that the semiconductor substrate 110 and the insulating member 200 shown in FIG. 12 are connected to each other. FIG. 14A is a cross-sectional view taken along line 14a-14a of FIG. 13; FIG. 14B is a cross-sectional view taken along line 14b-14b of FIG. 13; and FIG. 14C is a cross-sectional view taken along line 14c-14c of FIG. 13.

When the semiconductor substrate 110 of the solar cell is connected to the insulating member 200 as described above, one integrated type solar cell element may be formed by completely overlapping one semiconductor substrate 110 and one insulating member 200 as shown in FIG. 13.

For example, as shown in FIG. 14A, the first electrode C141 formed on the back surface of the semiconductor substrate 110 and the first connector P1f formed on the front surface of the insulating member 200 may overlap each other and may be electrically connected to each other using the electrode adhesive ECA.

Further, the second electrode C142 formed on the back surface of the semiconductor substrate 110 and the second connector P2f formed on the front surface of the insulating member 200 may overlap each other and may be electrically connected to each other using the electrode adhesive ECA.

The insulating layer IL may be filled in a space between the first and second electrodes C141 and C142. The insulating layer IL may also be filled in a space between the first and second connectors P1f and P2f.

As shown in FIG. 14B, the insulating layer IL may be filled in a space between the second connector P2f and the first pad P1b. As shown in FIG. 14C, the insulating layer IL may be filled in a space between the first connector P1f and the second pad P2b.

As shown in FIG. 13, the first pad P1b and the second pad P2b may respectively include first areas P1b-S1 and P2b-S1 overlapping the semiconductor substrate 110 and second areas P1b-S2 and P2b-S2 not overlapping the semiconductor substrate 110.

The interconnector IC may be connected to the second area P1b-S2 of the first pad P1b and the second area P2b-S2 of the second pad P2b, that are provided to secure a connection space of the interconnector IC.

Because the first pad P1b and the second pad P2b according to the embodiment of the invention respectively include the second areas P1b-S2 and P2b-S2, the connection of the interconnector IC may be more easily performed. Further, when the interconnector IC is connected to the insulating member 200, a thermal expansion stress of the semiconductor substrate 110 may be minimized.

The interconnector IC may be connected to the first pad P1b1 or the second pad P2b of the insulating member 200, so as to connect the plurality of individual integrated type solar cell elements as described above.

FIGS. 10 to 14C show that the individual integrated type solar cell element according to the embodiment of the invention includes the insulating member 200, as an example. On the contrary, the insulating member 200 may be removed after the first and second conductive lines P1 and P2 are connected to the first and second electrodes C141 and C142. The interconnector IC may be connected to the first conductive line P1 or the second conductive line P2 in a state where the insulating member 200 is removed.

So far, the embodiment of the invention described various examples of the solar cell module. Hereinafter, a method for manufacturing the above-described solar cell module according to the embodiment of the invention is described.

Figure 15:
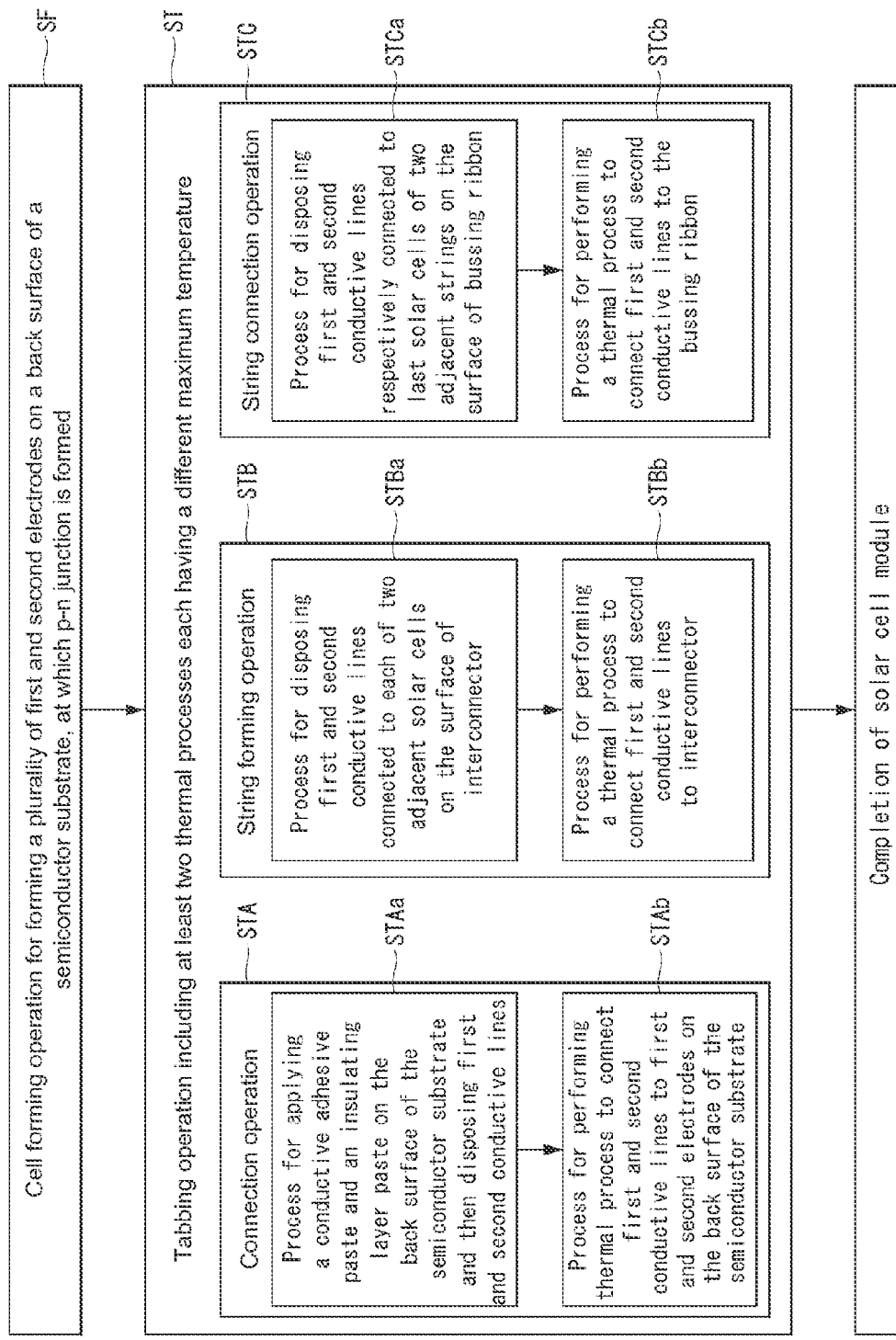
FIG. 15 is a flow chart showing a method for manufacturing a solar cell module according to one example embodiment of the invention.

FIG. 15 is a flow chart showing a method for manufacturing the solar cell module according to the embodiment of the invention.

As shown in FIG. 15, the method for manufacturing the solar cell module according to the embodiment of the invention may include a cell forming operation SF and a tabbing operation ST.

In the cell forming operation SF, as described in the first to third examples of the solar cell module according to the embodiment of the invention, the plurality of first electrodes C141 and the plurality of second electrodes C142 may be formed in parallel with each other on the back surface of the semiconductor substrate 110, at which the p-n junction is formed, thereby forming each of the plurality of solar cells.

The solar cell applied to the first to third examples of the solar cell module according to the embodiment of the invention may be formed through the cell forming operation SF.

After the cell forming operation SF, the tabbing operation ST may be performed. The tabbing operation ST may include at least one of a connection operation STA and a string forming operation STB. As shown in FIG. 15, the method for manufacturing the solar cell module according to the embodiment of the invention may further include a string connection operation STC.

The connection operation STA may connect the first conductive line P1 to the plurality of first electrodes C141 of each solar cell using the conductive adhesive CA and connect the second conductive line P2 to the plurality of second electrodes C142 of each solar cell using the conductive adhesive CA.

For this, the connection operation STA may include a process STAa for applying a paste used to form the conductive adhesive CA and a paste used to form the insulating layer IL on the back surface of the semiconductor substrate 110 of each solar cell and then aligning the first and second conductive lines P1 and P2 on the back surface of the semiconductor substrate 110 and a process STAb for performing a thermal process to connect the first and second conductive lines P1 and P2 to the first and second electrodes C141 and C142 formed on the back surface of the semiconductor substrate 110.

The string forming operation STB may connect the first conductive line P1 of one solar cell and the second conductive line P2 of other solar cell adjacent to the one solar cell to the interconnector IC to form a string including the plurality of solar cells connected in series to one another in the first direction x.

For this, the string forming operation STB may include a process STBa for disposing the first and second conductive lines P1 and P2 connected to each of the two solar cells, that are adjacent to each other along the first direction x, on the surface (for example, a back surface) of the interconnector IC and a process STBb for performing a thermal process to connect the first and second conductive lines P1 and P2 to the interconnector IC.

The string connection operation STC may connect the first conductive line P1 connected to the last solar cell positioned at an end of one string extending in the first direction x and the second conductive line P2 connected to the last solar cell positioned at an end of other string, that is adjacent to the one string and extends in the first direction x, to a bussing ribbon extending in the second direction y to connect the two adjacent strings.

For this, the string connection operation STC may include a process STCa for disposing the first and second conductive lines P1 and P2 respectively connected to the last solar cells of the two adjacent strings on the surface (for example, a back surface) of the bussing ribbon and a process STCb for performing a thermal process to connect the first and second conductive lines P1 and P2 to the interconnector IC.

The solar cell module may be completed through the cell forming operation SF and the tabbing operation ST.

The tabbing operation ST according to the embodiment of the invention may include the connection operation STA except the string forming operation STB, may include the connection operation STA and the string forming operation STB, or may include the connection operation STA, the string forming operation STB, and the string connection operation STC, if necessary or desired.

More specifically, if the second example of the solar cell module according to the embodiment of the invention is manufactured, the string forming operation STB may be excluded from the tabbing operation ST because the interconnector IC is not separately necessary. If the first and third examples of the solar cell module according to the embodiment of the invention are manufactured, the tabbing operation ST may include both the connection operation STA and the string forming operation STB.

In the method for manufacturing the solar cell module according to the embodiment of the invention, the tabbing operation ST including at least one of the connection operation STA and the string forming operation STB may include at least two thermal processes each having different thermal processing condition.

The thermal processing condition may include at least one of a temperature range, a maximum temperature, a minimum temperature, and a temperature profile of the thermal process, thermal processing time required in the thermal process, or a thermal processing method used in the thermal process.

Thus, the thermal processing conditions of the at least two thermal processes may be different from each other by differently changing heat application time in the thermal process, a maximum temperature, a minimum temperature, and an average temperature applied to a tabbing area in the thermal process, a temperature profile indicating changes in a temperature of the thermal process for thermal processing time, or a general thermal processing method using a hot plate, an oven, or an infrared (IR) lamp, etc.

In other words, the tabbing operation ST of the method for manufacturing the solar cell module according to the embodiment of the invention may include at least two thermal processes each having the different thermal processing condition including at least one of the temperature range, the maximum temperature, the minimum temperature, and the temperature profile of the thermal process, thermal processing time required in the thermal process, or the thermal processing method used in the thermal process.

For example, the tabbing operation ST of the method for manufacturing the solar cell module according to the embodiment of the invention may include at least two thermal processes each having a different maximum temperature.

For example, the connection operation STA may include two thermal processes each having a different maximum temperature. Alternatively, a thermal process may be once performed in the connection operation STA, and a thermal process may be once performed in the string forming operation STB. In this instance, a maximum temperature of the thermal process of the connection operation STA may be different from a maximum temperature of the thermal process of the string forming operation STB.

Alternatively, two thermal processes each having a different maximum temperature may be performed in the connection operation STA, and a thermal process may be once performed in the string forming operation STB. In this instance, a maximum temperature of the thermal process of the string forming operation STB may be different from the maximum temperatures of the two thermal processes of the connection operation STA.

Further, when the method for manufacturing the solar cell module according to the embodiment of the invention further includes the string connection operation STC, a maximum temperature of a thermal process in the string connection operation STC may be different from the maximum temperature of the thermal process in the connection operation STA or the string forming operation STB.

In the tabbing operation ST according to the embodiment of the invention, the connection operation STA, the string forming operation STB, and the string connection operation STC may be sequentially performed. However, after the thermal process of the connection operation STA is partially performed and then the thermal processes of the string forming operation STB and the string connection operation STC are performed, the thermal process of the connection operation STA may be again performed. Alternatively, after the thermal processes of the string forming operation STB and the string connection operation STC are performed, the thermal process of the connection operation STA may be performed.

Various examples of the method for manufacturing the solar cell module according to the embodiment of the invention are described in detail below.

The method for manufacturing the solar cell module according to the embodiment of the invention, in which the connection operation STA includes a thermal process of a plurality of first connection points and a plurality of second connection points at a first maximum temperature and a thermal process of the plurality of first connection points and the plurality of second connection points at a second maximum temperature different from the first maximum temperature, is described below.

In the embodiment disclosed herein, the plurality of first connection points indicate points or areas where the plurality of first electrodes C141 and the first conductive line P1 cross or overlap each other, and the plurality of second connection points indicate points or areas where the plurality of second electrodes C142 and the second conductive line P2 cross or overlap each other.

FIGS. 16 to 24 illustrate a method for manufacturing a solar cell module according to a first embodiment of the invention.

In the method for manufacturing the solar cell module according to the first embodiment of the invention, a connection operation STA may include a temporary attachment process STAb1 and a main attachment process STAb2 each having a different maximum temperature.

The method for manufacturing the solar cell module according to the first embodiment of the invention may include a process for applying a conductive adhesive paste CAP for forming the conductive adhesive CA and an insulating layer paste ILP for forming the insulating layer IL on the back surface of the semiconductor substrate 110 and then disposing the first and second conductive lines P1 and P2 on the back surface of the semiconductor substrate 110, the temporary attachment process STAb1 for thermally processing at least a portion of the first and second connection points at the first maximum temperature, and the main attachment process STAb2 for thermally processing all of the first and second connection points including at least a portion of the first and second connection points at the second maximum temperature higher than the first maximum temperature.

Figure 17:
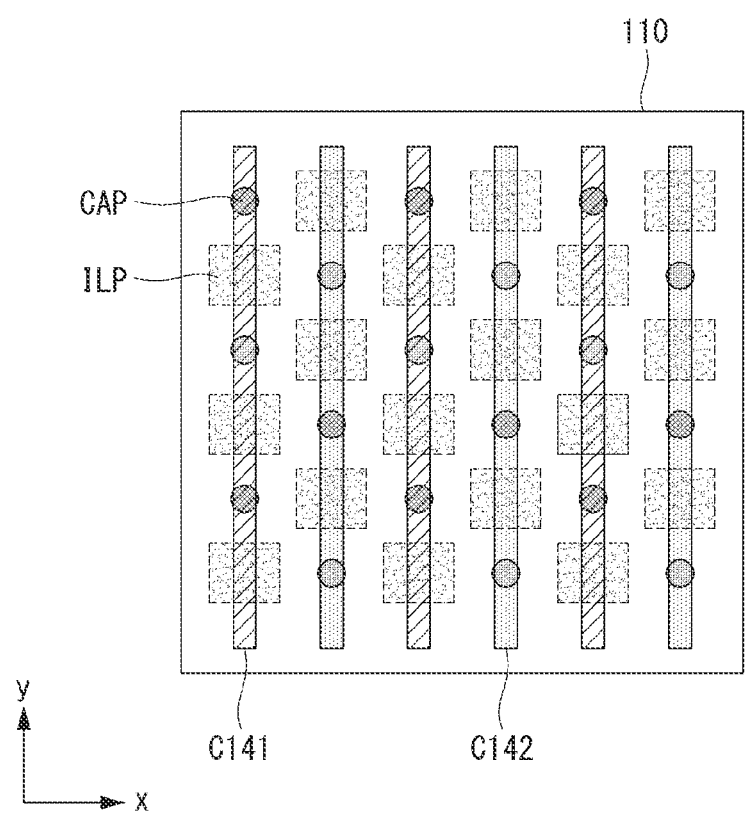

More specifically, as shown in FIG. 17 using the first and second examples of the solar cell module according to the embodiment of the invention as an example, when the conductive adhesive paste CAP and the insulating layer paste ILP are applied on the back surface of the semiconductor substrate 110, on which the first and second electrodes C141 and C142 are formed, the first and second conductive lines P1 and P2 may be disposed to cross the first and second electrodes C141 and C142. Therefore, the conductive adhesive paste CAP may be applied to a portion of the first and second electrodes C141 and C142, which will be electrically connected to the first and second conductive lines P1 and P2, and the insulating layer paste ILP may be applied to a portion of the first and second electrodes C141 and C142, which will be electrically insulated from the first and second conductive lines P1 and P2.

As shown in FIG. 17, an application area of the insulating layer paste ILP may be greater than an application area of the conductive adhesive paste CAP, so that a formation area of the insulating layer IL is greater than a formation area of the conductive adhesive CA at the back surface of the semiconductor substrate 110.

Figure 18:
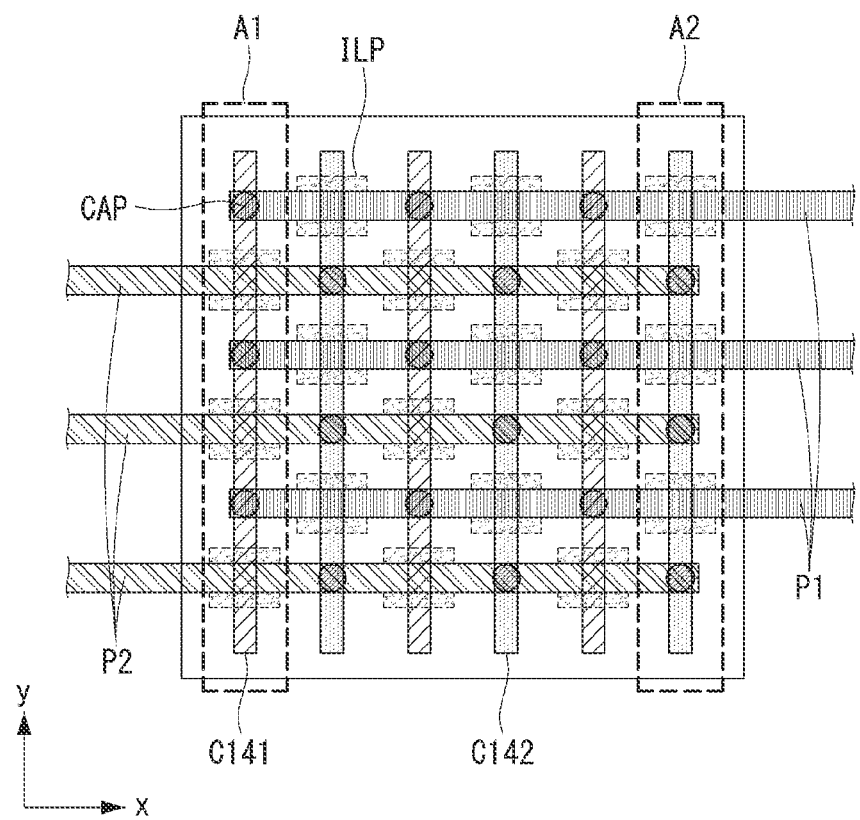

Afterwards, as shown in FIG. 18, the first and second conductive lines P1 and P2 may be disposed to cross the first and second electrodes C141 and C142.

In FIG. 18, the plurality of first connection points may indicate portions where the plurality of first electrodes C141 and the plurality of first conductive lines P1 cross each other, and the plurality of second connection points may indicate portions where the plurality of second electrodes C142 and the plurality of second conductive lines P2 cross each other.

Figure 16:
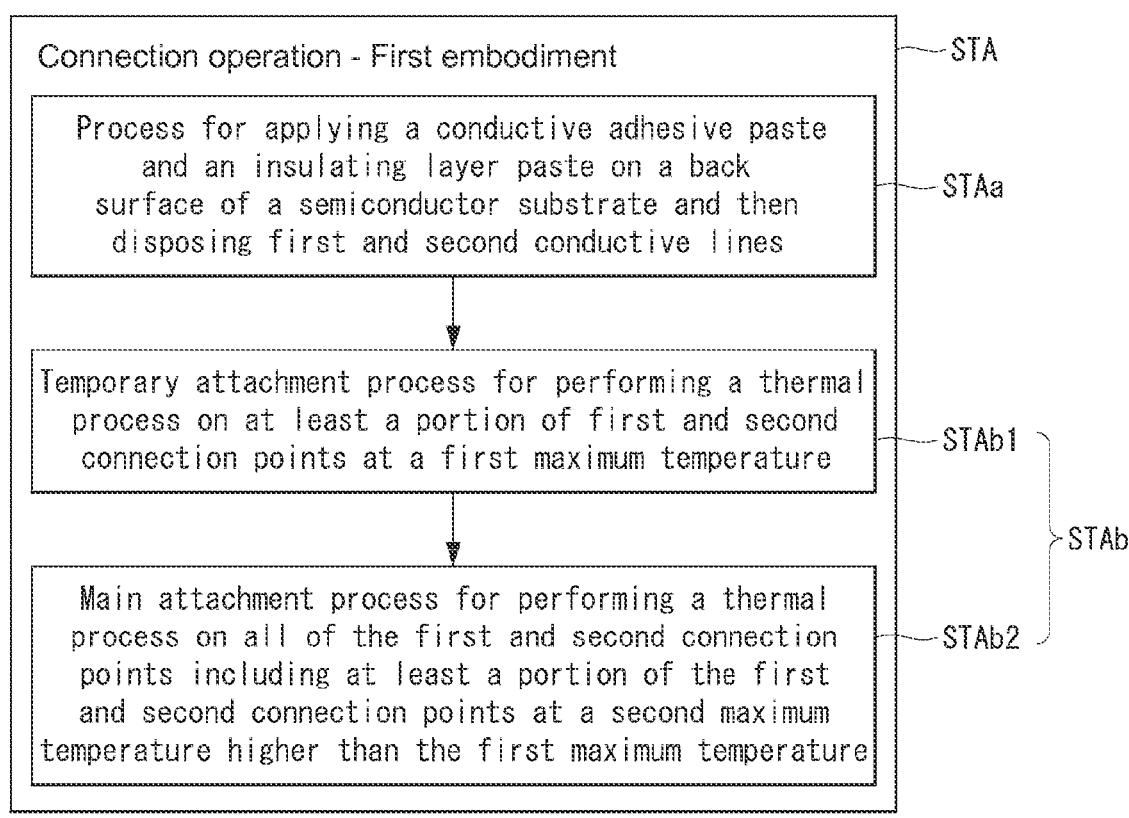
FIGS. 16 to 24 illustrate a method for manufacturing a solar cell module according to a first embodiment of the invention.

In the temporary attachment process STAb1 of FIG. 16 in a state where the plurality of first and second connection points are formed, at least a portion of the plurality of first connection points and at least a portion of the plurality of second connection points may be thermally processed at the first maximum temperature.

The first maximum temperature of the temporary attachment process STAb1 may be 70° C. to 150° C.

For example, in FIG. 18, the temporary attachment process STAb1 for thermally processing a portion of the first and second connection points positioned in areas A1 and A2 at the first maximum temperature of 70° C. to 150° C. may be performed using a point attachment device such as a laser. On the contrary, the temporary attachment process STAb1 may be performed on all of the first and second connection points including the portion of the first and second connection points positioned in the areas A1 and A2.

In the temporary attachment process STAb1, the conductive adhesive paste CAP and the insulating layer paste ILP applied to the portion of the first and second connection points positioned in the areas A1 and A2 may be partially cured, and the first and second conductive lines P1 and P2 may be attached and fixed to the first and second electrodes C141 and C142 in the areas A1 and A2.

After the temporary attachment process STAb1 is performed, in the main attachment process STAb2 of FIG. 16, all of the first and second connection points including at least a portion of the first and second connection points may be thermally processed at the second maximum temperature higher than the first maximum temperature.

In the main attachment process STAb2, the conductive adhesive paste CAP and the insulating layer paste ILP positioned in all of the first and second connection points including the portion of the first and second connection points positioned in the areas A1 and A2 may be entirely cured to form the conductive adhesive CA and the insulating layer IL, respectively.

The second maximum temperature of the main attachment process STAb2 may be 140° C. to 400° C. within a temperature range higher than the first maximum temperature.

Figure 19:
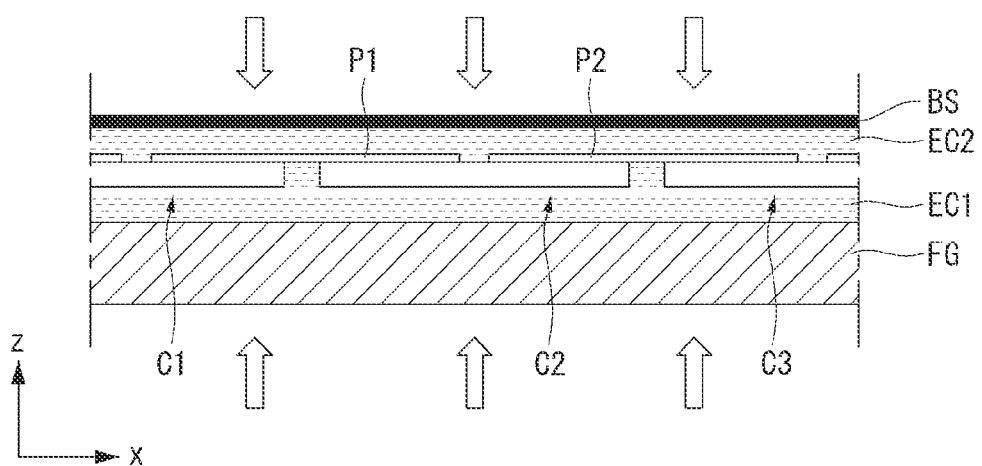

As shown in FIG. 19, when the main attachment process STAb2 is performed at the second maximum temperature of, for example, 145° C. to 170° C., the main attachment process STAb2 may be performed along with the lamination process for thermal pressurization performed in a state where the plurality of solar cells C1 to C3, to which the first and second conductive lines P1 and P2 are temporarily attached, are positioned on the first encapsulant EC1 applied on the front transparent substrate FG, and then the second encapsulant EC2 and the back sheet BS are disposed on the plurality of solar cells C1 to C3.

The connection operation STA may be performed by fixing the first and second conductive lines P1 and P2 to the first and second electrodes C141 and C142 formed on the semiconductor substrate 110 through the temporary attachment process STAb1 and then electrically connecting the first and second conductive lines P1 and P2 to the first and second electrodes C141 and C142 through the main attachment process STAb2. In this instance, because the main attachment process STAb2 is performed in the lamination process, a bending phenomenon of the semiconductor substrate 110 resulting from a difference between thermal expansion coefficients of the semiconductor substrate 110 and the first and second conductive lines P1 and P2 may be minimized.

Figure 20A:
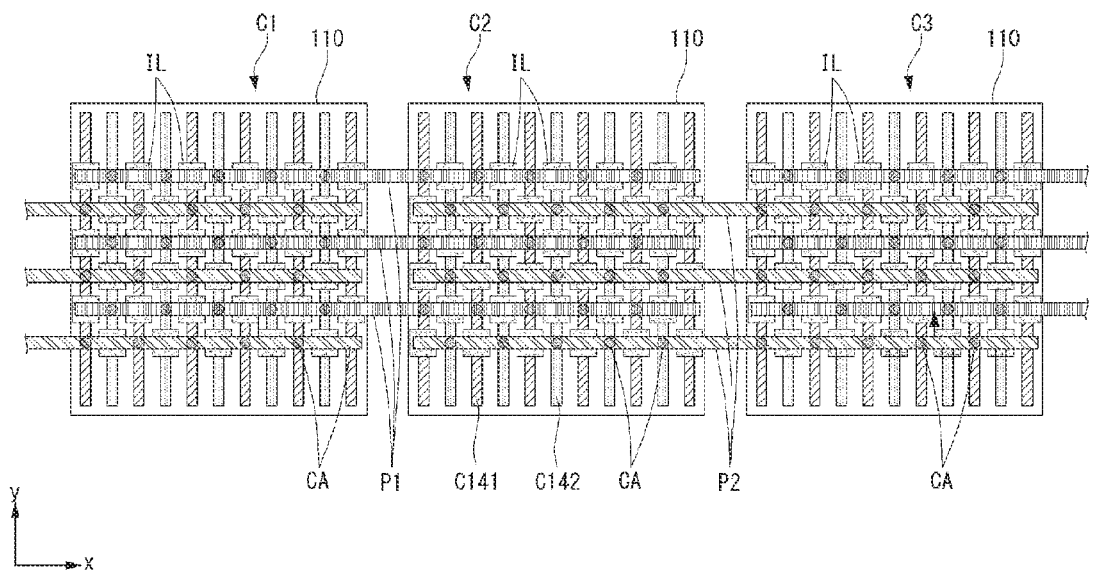

As shown in FIG. 20A using the second example of the solar cell module according to the embodiment of the invention as an example, when the first and second conductive lines P1 and P2 overlap the two semiconductor substrates 110 of the two adjacent solar cells, the two adjacent solar cells may be connected in series to each other through the connection operation STA shown in FIG. 16, thereby forming the string. Thus, the string forming operation STB shown in FIG. 15 may be omitted.

Figure 20B:
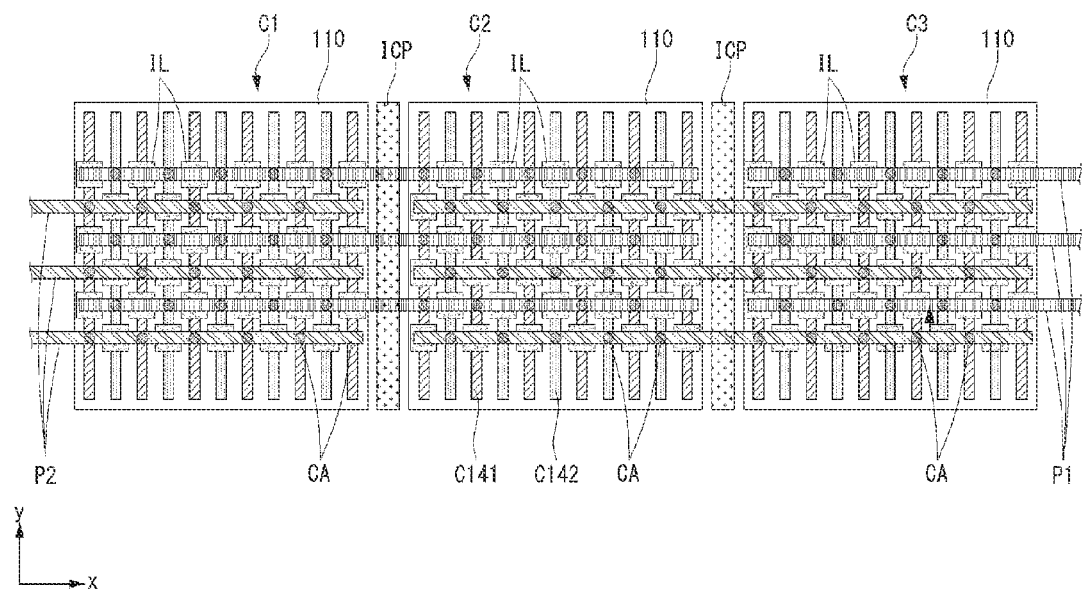

In the second example of the solar cell module according to the embodiment of the invention, as shown in FIG. 20B, a metal pad ICP may be positioned between the semiconductor substrates 110 of the adjacent solar cells and may be separated from the semiconductor substrates 110, so as to reflect light incident between the adjacent solar cells. The metal pad ICP does not serve as the interconnector IC described in the first and third examples of the solar cell module according to the embodiment of the invention. The metal pad ICP may extend in the second direction y, that is the same as the longitudinal direction of the first and second electrodes C141 and C142, and may be connected to the first and second conductive lines P1 and P2.

The metal pad ICP may be connected to the plurality of first conductive lines P1 and the plurality of second conductive lines P2 through the temporary attachment process STAb1 and the main attachment process STAb2.

The method for manufacturing the solar cell module according to the first embodiment of the invention described that it includes the process for applying the conductive adhesive paste CAP, as an example. However, when the conductive adhesive CA is previously coated on the surfaces of the first and second conductive lines P1 and P2, the process for applying the conductive adhesive paste CAP may be omitted in the connection operation STA.

So far, the embodiment of the invention described that the method for manufacturing the solar cell module according to the first embodiment of the invention illustrated in FIG. 16 is applied to the first and second examples of the solar cell module according to the embodiment of the invention, as an example. However, the method for manufacturing the solar cell module according to the first embodiment of the invention illustrated in FIG. 16 may be applied to the third example of the solar cell module according to the embodiment of the invention.

Figure 21:
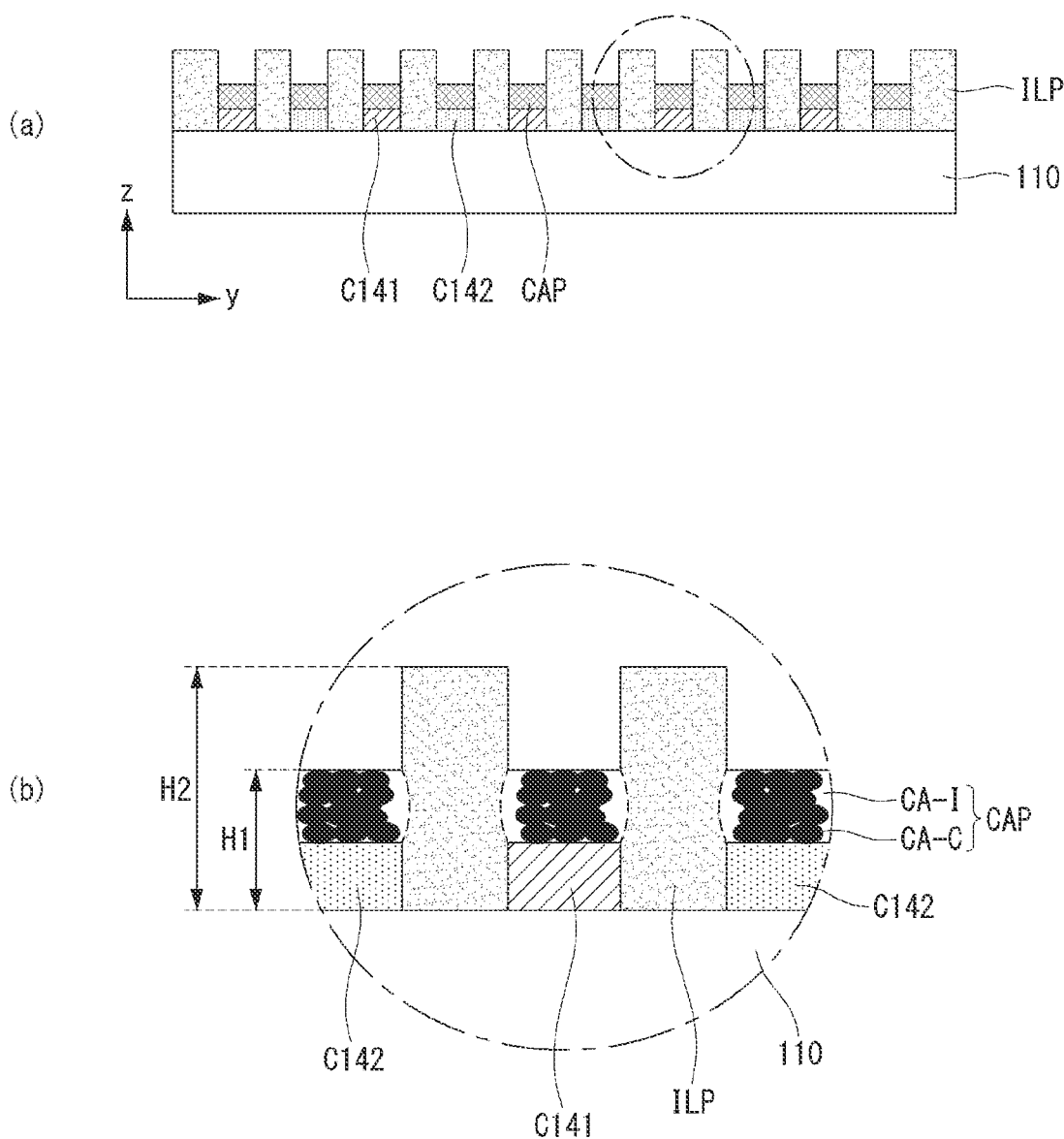

More specifically, as shown in (a) of FIG. 21, in the process STAa of the connection operation STA in the method for manufacturing the solar cell module according to the first embodiment of the invention, the conductive adhesive paste CAP may be applied on the first and second electrodes C141 and C142 formed on the back surface of the semiconductor substrate 110, and the insulating layer paste ILP may be applied on the back surface of the semiconductor substrate 110 exposed between the first and second electrodes C141 and C142.

A thickness of the insulating layer paste ILP may be greater than a thickness of the conductive adhesive paste CAP. As shown in (b) of FIG. 21, a height H2 from the back surface of the semiconductor substrate 110 to an end of the insulating layer paste ILP may be greater than a height H1 from the back surface of the semiconductor substrate 110 to an end of the conductive adhesive paste CAP.

In this instance, the conductive adhesive paste CAP may be configured in the form of a conductive paste including conductive metal particles CA-P and an insulating resin CA-I, and the insulating layer paste ILP may include a resin.

The insulating resin CA-I of the conductive adhesive paste CAP and the resin of the insulating layer paste ILP may be thermoplastic resin. For example, at least one of epoxy-based resin, acrylic-based resin, or silicon-based resin may be used.

Further, the insulating resin CA-I of the conductive adhesive paste CAP and the resin of the insulating layer paste ILP may be a resin formed of the same material.

Thus, the insulating resin CA-I of the conductive adhesive paste CAP and the resin of the insulating layer paste ILP may have almost the same thermal expansion coefficient.

Hence, when the thermal process is performed, a chemical reaction between the insulating resin CA-I of the conductive adhesive paste CAP and the insulating layer paste ILP may be suppressed, the generation of bubbles may be prevented, and the first and second electrodes C141 and C142 and the first and second conductive lines P1 and P2 may be prevented from being out of alignment because of the thermal expansion coefficient difference.

Figure 22:
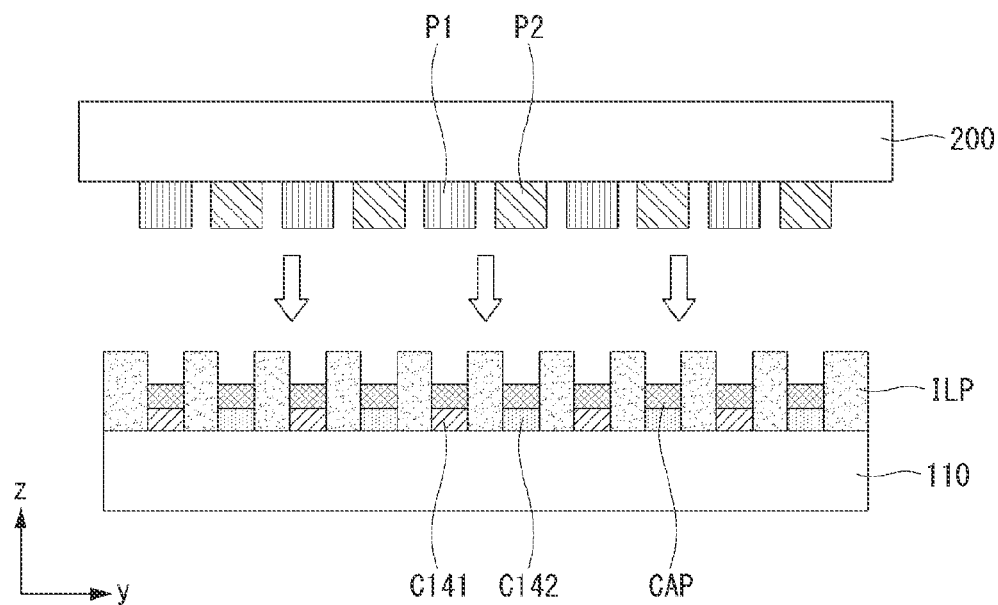

Afterwards, as shown in FIG. 22, the first and second conductive lines P1 and P2 included in the insulating member 200 may be aligned to overlap the first and second electrodes C141 and C142 formed on the semiconductor substrate 110, and then the insulating member 200 may be pressed in a direction indicated by an arrow shown in FIG.

Figure 23:
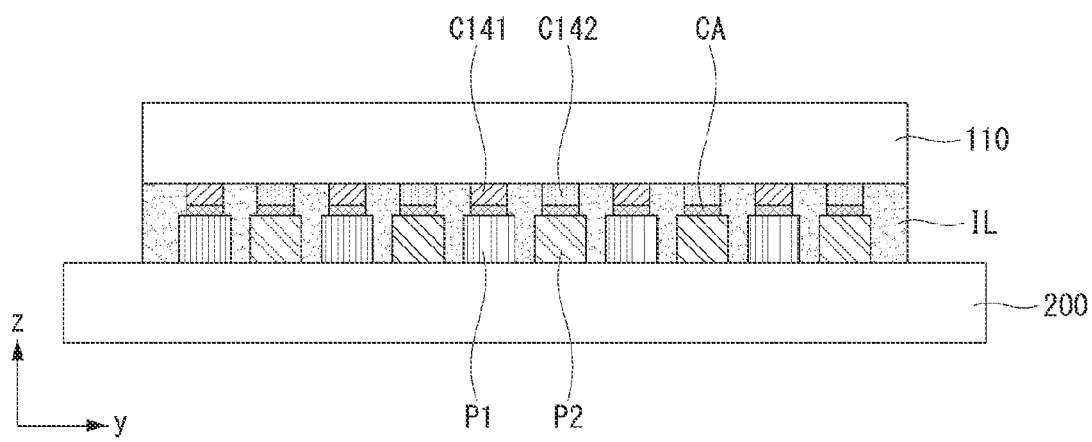

22. Hence, as shown in FIG. 23, the insulating member 200 may be disposed on the back surface of the semiconductor substrate 110.

Figure 24:
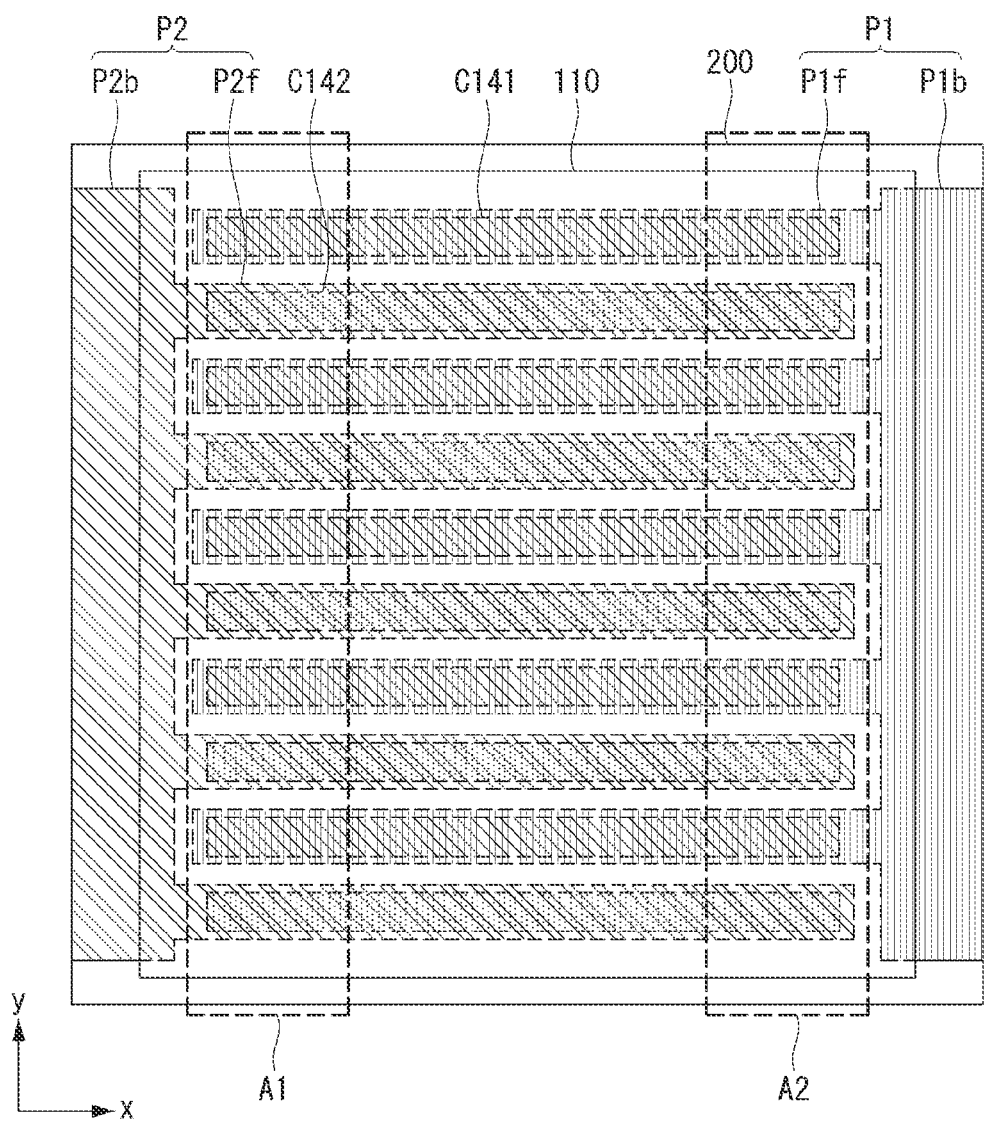

As shown in FIG. 24 which is a plane view showing a disposition state of the semiconductor substrate 110 and the insulating member 200, the plurality of first electrodes C141 and the first conductive line P1 may overlap each other, and the plurality of second electrodes C142 and the second conductive line P2 may overlap each other.

Hence, the plurality of first connection points where the plurality of first electrodes C141 and the first conductive line P1 overlap each other and the plurality of second connection points where the plurality of second electrodes C142 and the second conductive line P2 overlap each other may be formed.

The conductive adhesive CA may be positioned between the first electrode C141 and the first conductive line P1. Further, the conductive adhesive CA may be positioned between the second electrode C142 and the second conductive line P2.

As shown in FIG. 24, the temporary attachment process STAb1 for thermally processing the portion of the first and second connection points positioned in the areas A1 and A2, in a state where the plurality of first and second connection points are formed, at the first maximum temperature of 70° C. to 150° C. may be performed. On the contrary, the temporary attachment process STAb1 may be performed on all of the first and second connection points including the portion of the first and second connection points positioned in the areas A1 and A2.

In the temporary attachment process STAb1, the conductive adhesive paste CAP and the insulating layer paste ILP applied to the portion of the first and second connection points positioned in the areas A1 and A2 may be partially cured, and the first and second conductive lines P1 and P2 may be attached and fixed to the first and second electrodes C141 and C142 in the areas A1 and A2.

After the temporary attachment process STAb1 is performed, in the main attachment process STAb2 of FIG. 16, all of the first and second connection points including at least a portion of the first and second connection points may be thermally processed at the second maximum temperature higher than the first maximum temperature.

In the main attachment process STAb2, the conductive adhesive paste CAP and the insulating layer paste ILP positioned in all of the first and second connection points including the portion of the first and second connection points positioned in the areas A1 and A2 of FIG. 24 may be entirely cured to form the conductive adhesive CA and the insulating layer IL, respectively.

The second maximum temperature of the main attachment process STAb2 may be 140° C. to 400° C. within a temperature range higher than the first maximum temperature.

So far, the embodiment of the invention described that the connection operation STA includes the temporary attachment process STAb1 and the main attachment process STAb2, as an example. Hereinafter, the embodiment of the invention describes that the connection operation STA includes a high melting point thermal process and a low melting point thermal process.

Figure 25:
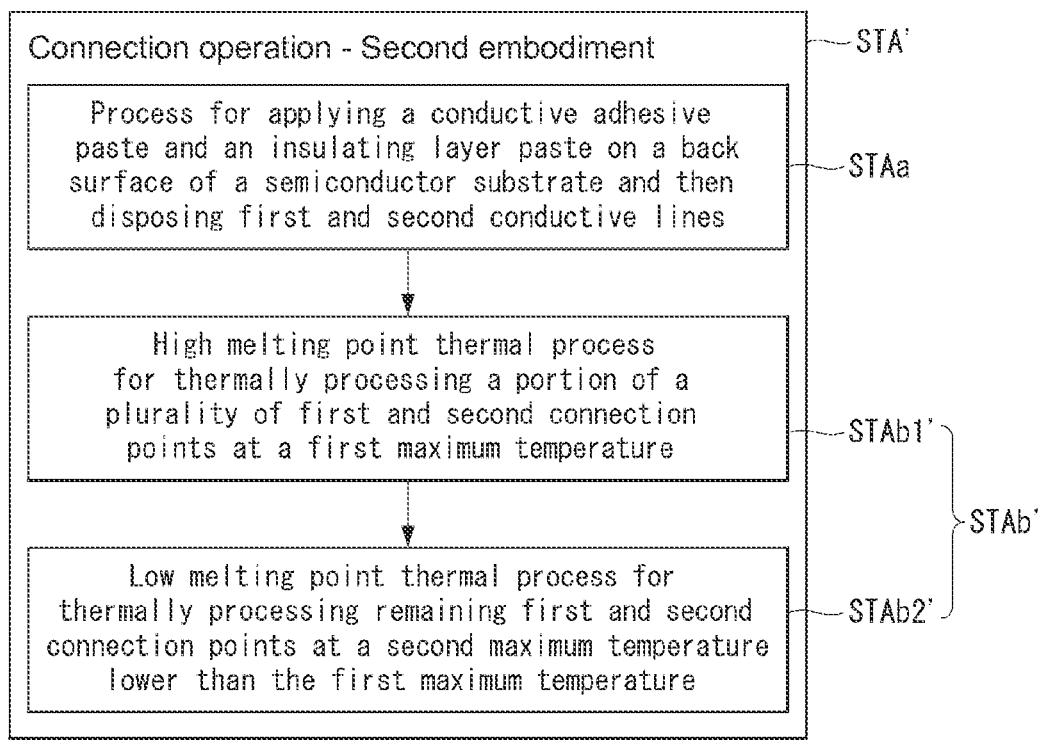
FIGS. 25 to 27 illustrate a method for manufacturing a solar cell module according to a second embodiment of the invention.
Figure 26:
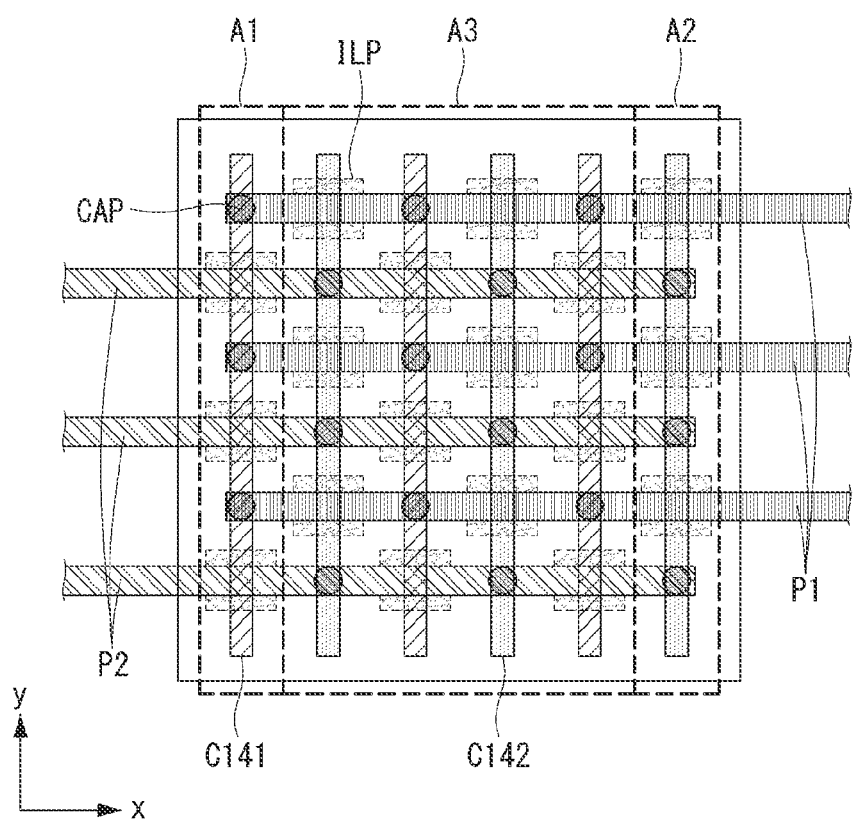
Figure 27:
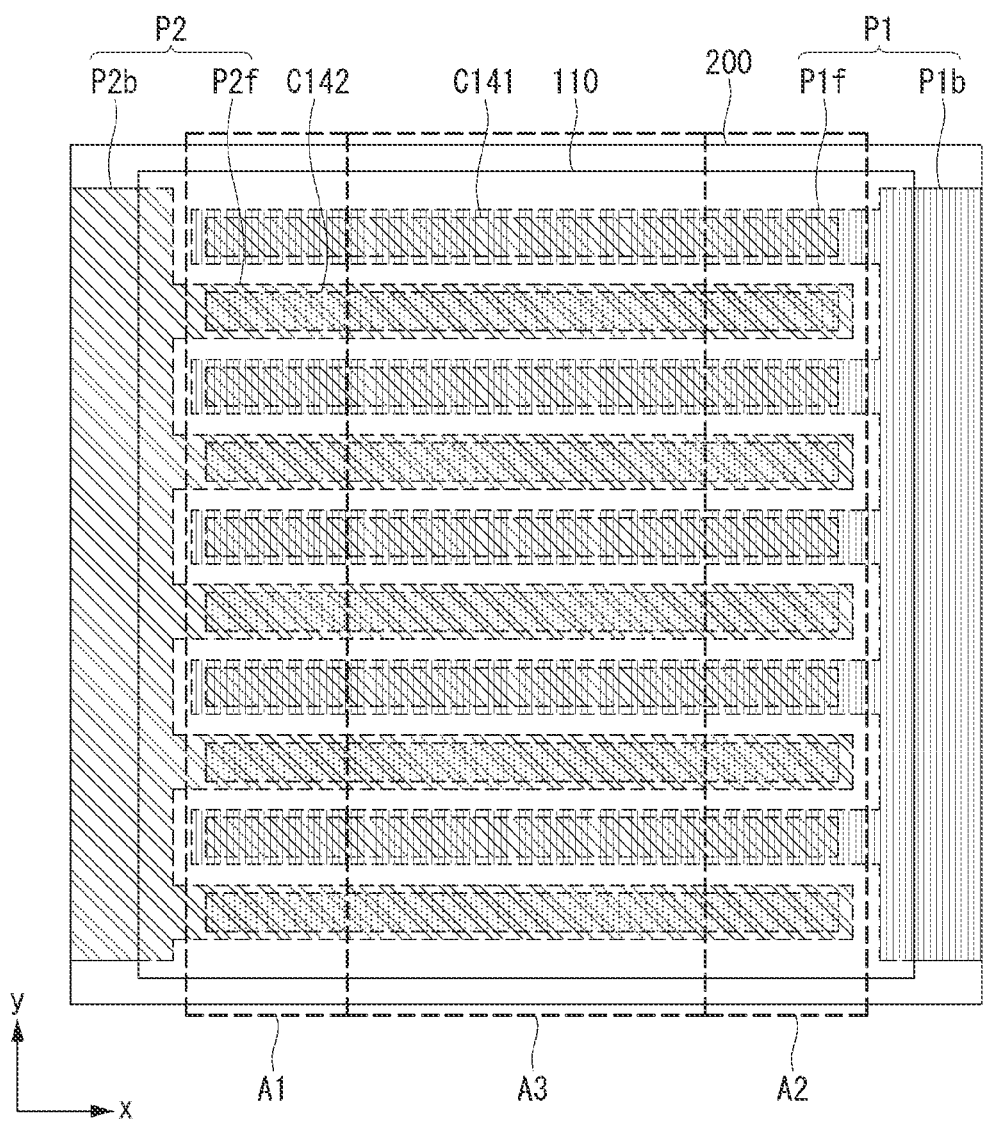

FIGS. 25 to 27 illustrate a method for manufacturing a solar cell module according to a second embodiment of the invention.

In the method for manufacturing the solar cell module according to the second embodiment of the invention, a connection operation STA' may include a high melting point thermal process STAb1' and a low melting point thermal process STAb2" each having a different maximum temperature.

As shown in FIG. 25, the connection operation STA' according to the second embodiment of the invention may include a process STAa for disposing first and second conductive lines P1 and P2, the high melting point thermal process STAb1', and the low melting point thermal process STAb2'.

The process STAa for disposing the first and second conductive lines P1 and P2 may be performed after a conductive adhesive paste CAP for forming a conductive adhesive CA and an insulating layer paste ILP for forming an insulating layer IL are applied on a back surface of a semiconductor substrate 110. As shown in FIG. 26 or FIG. 27, the first and second conductive lines P1 and P2 may be disposed on the back surface of the semiconductor substrate 110.

Hence, as shown in FIGS. 26 and 27, a plurality of first connection points may be formed in portions where a plurality of first electrodes C141 and the plurality of first conductive lines P1 cross or overlap each other, and a plurality of second connection points may be formed in portions where a plurality of second electrodes C142 and the plurality of second conductive lines P2 cross or overlap each other.

Since the process STAa for applying the conductive adhesive paste CAP and the insulating layer paste ILP in the second embodiment of the invention is substantially the same as the first embodiment of the invention, a further description may be briefly made or may be entirely omitted.

For example, in the connection operation STA' according to the second embodiment of the invention, the conductive adhesive paste CAP including a first solder material having a relatively high melting point may be applied between the first electrode C141 and the first conductive line P1 and between the second electrode C142 and the second conductive line P2 in areas A1 and A2 shown in FIGS. 26 and 27. Further, the conductive adhesive paste CAP including a second solder material having a relatively low melting point may be applied between the first electrode C141 and the first conductive line P1 and between the second electrode C142 and the second conductive line P2 in an area A3 shown in FIGS. 26 and 27.

In the embodiment disclosed herein, SnPb may be used as an example of the first solder material of the high melting point, and SnIn or SnBi may be used as an example of the second solder material of the low melting point.

Next, the high melting point thermal process STAb1', a portion of the plurality of first connection points and a portion of the plurality of second connection points may be thermally processed at a first maximum temperature.

More specifically, for example, a portion of the plurality of first and second connection points positioned in the areas A1 and A2 shown in FIGS. 26 and 27 may be thermally processed at the first maximum temperature using a point attachment device such as a laser.

In the embodiment disclosed herein, the first maximum temperature of the high melting point thermal process STAb1' may be 150° C. to 400° C., preferably, 150° C. to 300° C.

Afterwards, in the low melting point thermal process STAb2', remaining first and second connection points among the plurality of first and second connection points may be thermally processed at a second maximum temperature lower than the first maximum temperature.

More specifically, for example, the remaining first and second connection points positioned in the area A3 shown in FIGS. 26 and 27 may be thermally processed at the second maximum temperature.

In the embodiment disclosed herein, the second maximum temperature of the low melting point thermal process STAb2' may be 140° C. to 180° C. within a temperature range lower than the first maximum temperature.

In the connection operation STA' according to the second embodiment of the invention, a thermal process area of the high melting point thermal process STAb1' having the relatively high maximum temperature may be minimized. Thus, an influence of the thermal process applied to the semiconductor substrate 110 may be minimized. As a result, the bending or a damage of the semiconductor substrate 110 may be minimized.

As described above, when the low melting point thermal process STAb2' is performed after the high melting point thermal process STAb1', at least a portion of the plurality of first conductive lines P1 and at least a portion of the plurality of second conductive lines P2 are respectively connected to the first and second electrodes C141 and C142 through the high melting point thermal process STAb1'. Therefore, in the low melting point thermal process STAb2', the conductive adhesive paste CAP including the first solder material of the high melting point is not again melted, and only the conductive adhesive paste CAP including the second solder material of the low melting point may be cured.

Thus, the first and second conductive lines P1 and P2 may be prevented from being out of alignment during the low melting point thermal process STAb2' because of a thermal expansion stress.

The second embodiment of the invention described that the remaining first and second connection points are thermally processed in the low melting point thermal process STAb2', as an example. However, in the low melting point thermal process STAb2', all of the first and second connection points including the remaining first and second connection points may be thermally processed at the second maximum temperature of 140° C. to 180° C.

In this instance, the temperature of the low melting point thermal process STAb2' may be the same as a temperature of a lamination process, and thus the low melting point thermal process STAb2' may be performed during the lamination process.

When the first and second conductive lines P1 and P2 are formed in the form of a conductive wire or a conductive ribbon, the first and second conductive lines P1 and P2 may cross and may be connected to the first and second electrodes C141 and C142 of each solar cell through the connection operation STA' as in the first and second examples of the solar cell module according to the embodiment of the invention.

Further, when the first and second conductive lines P1 and P2 are patterned on the insulating member 200, the semiconductor substrate 110 of each solar cell and each insulating member 200 may be connected to each other through the connection operation STA' to form an individual integrated type solar cell element as in the third example of the solar cell module according to the embodiment of the invention.

So far, the embodiment of the invention described various examples of the connection operation STA including the two thermal processes each having the different maximum temperature. As described above, the maximum temperature of the thermal process of the connection operation STA may be different from the maximum temperature of the thermal process of the string forming operation STB. This is described in detail below.

Figure 28:
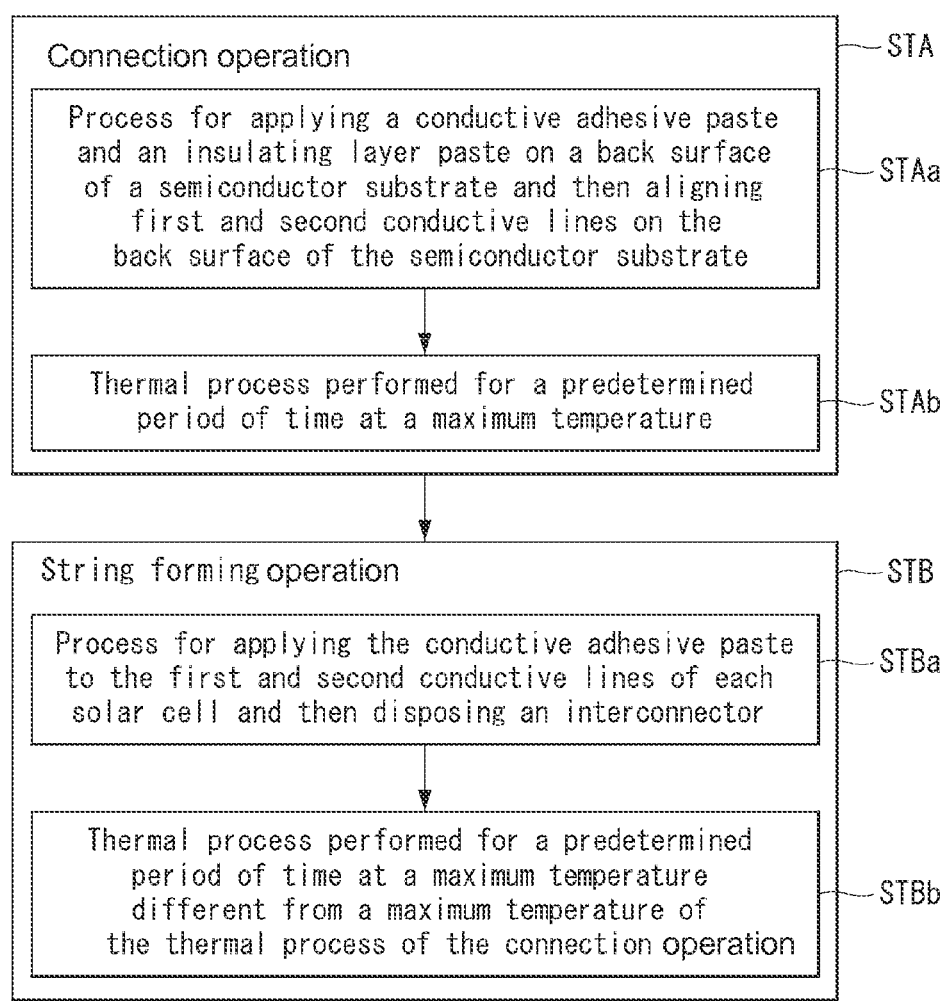
FIGS. 28 to 30 illustrate a method for manufacturing a solar cell module according to a third embodiment of the invention.
Figure 29:
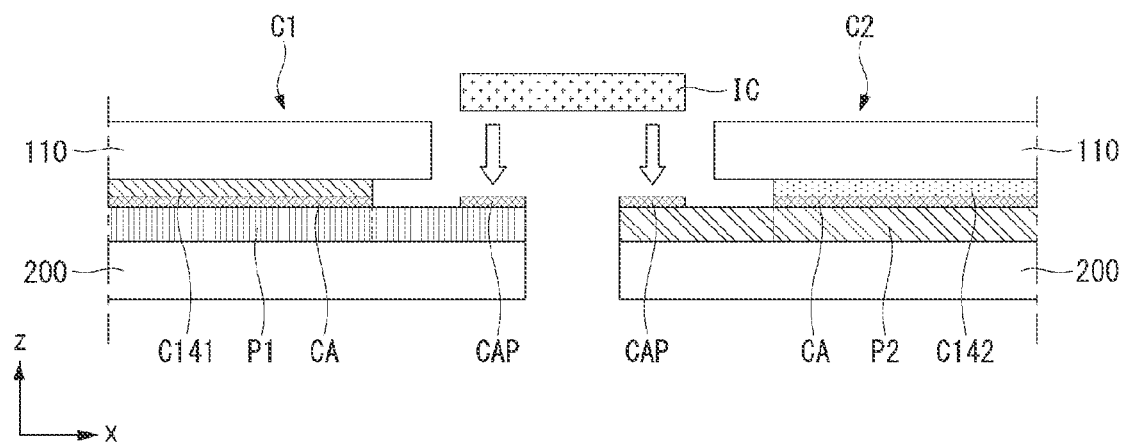
Figure 30:
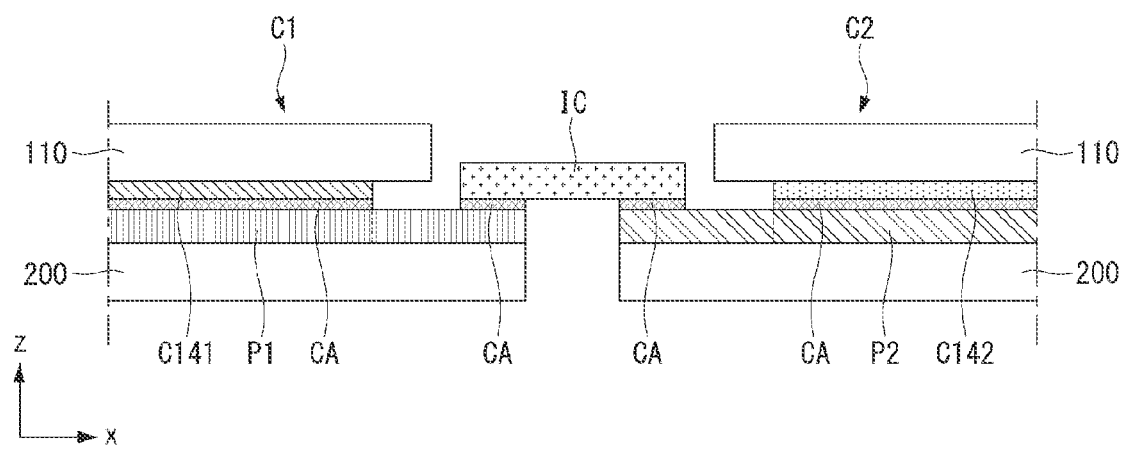

FIGS. 28 to 30 illustrate a method for manufacturing a solar cell module according to a third embodiment of the invention.

In the method for manufacturing the solar cell module according to the third embodiment of the invention, a temperature of a thermal process STAb of a connection operation STA may be different from a temperature of a thermal process of a string forming operation STB.

As shown in FIG. 28, the method for manufacturing the solar cell module according to the third embodiment of the invention may include the connection operation STA and the string forming operation STB.

In the third embodiment of the invention, the connection operation STA may include a process STAa for applying a conductive adhesive paste CAP and an insulating layer paste ILP on a back surface of a semiconductor substrate 110 and then disposing first and second conductive lines P1 and P2 and the thermal process STAb performed for a predetermined period of time.

Next, the string forming operation STB may include a process STBa for applying the conductive adhesive paste CAP to the first and second conductive lines P1 and P2 of each solar cell and then disposing an interconnector IC and a thermal process STBb performed for a predetermined period of time at a maximum temperature different from a maximum temperature of the thermal process STAb of the connection operation STA.

As described above, in the third embodiment of the invention, the maximum temperature of the thermal process STAb of the connection operation STA may be different from the maximum temperature of the thermal process STBb of the string forming operation STB.

More specifically, the thermal process STAb of the connection operation STA may be performed for 5 minutes to 30 minutes at the maximum temperature of 140° C. to 400° C. Further, the thermal process STBb of the string forming operation STB may be performed for 1 second to 1 minute at the maximum temperature different from the maximum temperature of the thermal process STAb of the connection operation STA within a temperature range of 140° C. to 400° C.

FIG. 28 shows that the string forming operation STB is performed after the connection operation STA is performed, as an example. On the contrary, the connection operation STA may be performed after the string forming operation STB is performed.

The thermal process STAb of the connection operation STA according to the third embodiment of the invention may include the connection operation STA according to the first and second embodiments of the invention. However, the third embodiment of the invention describes the connection operation STA different from the connection operation STA according to the first and second embodiments of the invention, as an example.

This is described in detail below.

Since the process STAa of the connection operation STA for applying the conductive adhesive paste CAP and the insulating layer paste ILP on the back surface of the semiconductor substrate 110 and then disposing the first and second conductive lines P1 and P2 is substantially the same as the first and second embodiments of the invention, a further description may be briefly made or may be entirely omitted.

For example, when a solder paste is used as the conductive adhesive paste CAP in the process STAa, the thermal process STAb of the connection operation STA may be performed for 10 minutes to 20 minutes at the maximum temperature of 140° C. to 180° C.

As described above, because the thermal process STAb of the connection operation STA is performed at the relatively low maximum temperature, a thermal expansion stress applied to the semiconductor substrate 110 may be minimized.

Thus, in the thermal process STAb of the connection operation STA, a conductive adhesive CA may connect the plurality of first electrodes C141 and the first conductive lines P1 and connect the plurality of second electrodes C142 and the second conductive lines P2, and also an insulating layer IL may insulate between the first and second electrodes C141 and C142 and between the first and second conductive lines P1 and P2.

Next, as shown in FIG. 29, in the process STBa of the string forming operation STB, the conductive adhesive paste CAP may be applied to the first and second conductive lines P1 and P2 of each solar cell, and then the interconnector IC may be disposed in a direction indicated by an arrow shown in FIG. 29.

A material of the conductive adhesive paste CAP is not particularly limited as long as it is a conductive material. For example, a solder paste, a conductive paste including conductive metal particles and an insulating resin, or a conductive adhesive film may be used for the conductive adhesive paste CAP.

FIG. 29 shows the method for manufacturing the solar cell module according to the third embodiment of the invention using the third example of the solar cell module according to the embodiment of the invention as an example. However, the method shown in FIG. 29 may be applied to the first example of the solar cell module according to the embodiment of the invention. In the first example of the solar cell module, because the first and second conductive lines P1 and P2 each have the relatively small width, the first and second conductive lines P1 and P2 may be disposed on the surface (for example, the back surface) of the interconnector IC, to which the conductive adhesive paste CAP is applied, in a state where the conductive adhesive paste CAP is applied to the interconnector IC.

Afterwards, in the thermal process STBb of the string forming operation STB, the thermal process may be performed for the predetermined period of time at the maximum temperature different from the maximum temperature of the thermal process STAb of the connection operation STA, thereby forming one string as shown in FIG. 30.

For example, the maximum temperature of the thermal process STBb of the string forming operation STB may be higher than the maximum temperature of the thermal process STAb of the connection operation STA.

For example, the maximum temperature of the thermal process STBb of the string forming operation STB may be 150° C. to 300° C. within a temperature range higher than the maximum temperature of the thermal process STAb of the connection operation STA. However, the maximum temperature of the thermal process STBb of the string forming operation STB does not need to be certainly higher than the maximum temperature of the thermal process STAb of the connection operation STA. The maximum temperature of the thermal process STBb of the string forming operation STB may be further reduced depending on the material of the conductive adhesive CA used to attach the interconnector IC.

For example, when the solder paste is used as the material of the conductive adhesive CA used to attach the interconnector IC, the maximum temperature of the thermal process STBb of the string forming operation STB may be higher than the maximum temperature of the thermal process STAb of the connection operation STA. However, when a conductive adhesive film including conductive metal particles and an insulating resin is used as the material of the conductive adhesive CA used to attach the interconnector IC, the maximum temperature of the thermal process STBb of the string forming operation STB may be lower than the maximum temperature of the thermal process STAb of the connection operation STA.

Further, time required in the thermal process STBb of the string forming operation STB may be shorter than time required in the thermal process STAb of the connection operation STA. For example, time required in the thermal process STBb of the string forming operation STB may be 1 second to 1 minute.

More specifically, when the solder paste is used as the material of the conductive adhesive CA used to attach the interconnector IC, heat and pressure may be simultaneously applied. In this instance, the thermal process STBb of the string forming operation STB may be performed for 1 second to 4 seconds at a temperature of about 240° C. to 280° C.

Further, when a conductive adhesive film is used as an adhesive ICA of the interconnector IC, time required in the thermal process STBb of the string forming operation STB may be 5 seconds to 23 seconds. Time required in the thermal process STBb of the string forming operation STB may be 1 minute, if necessary or desired.

Unlike FIG. 28, the thermal process STBb of the string forming operation STB may include a temporary attachment process and a main attachment process performed at a maximum temperature higher than a maximum temperature of the temporary attachment process.

In this instance, in the temporary attachment process, the interconnector IC may be fixed to each of the plurality of first and second conductive lines P1 and P2, and the plurality of solar cells may be connected in series to one another to form the string.

The main attachment process may be performed after the temporary attachment process. A contact resistance between the interconnector IC and the plurality of first and second conductive lines P1 and P2 may be further improved through the main attachment process.

In other words, the contact resistance between the interconnector IC and the plurality of first and second conductive lines P1 and P2 may be greatly reduced through the main attachment process. The main attachment process may be performed through the lamination process included in the method for manufacturing the solar cell module.

More specifically, the temporary attachment process may be performed at a temperature of 80° C. to 100° C. and a pressure of 0.2 MPa (Pascal) in about 1 second. The main attachment process may be performed at a temperature of 170° C. to 190° C. and a pressure of 2 MPa (Pascal) for about 10 seconds to 20 seconds.

As described above, because time required in the thermal process STBb of the string forming operation STB is shorter than time required in the thermal process STAb of the connection operation STA, the thermal expansion stress of the semiconductor substrate 110 may be minimized when the interconnector IC is connected. Further, degradation in an adhesive strength or the contact resistance of the conductive adhesive CA may be minimized.

FIGS. 28 to 30 illustrate the method for manufacturing the solar cell module according to the third embodiment of the invention using the third example of the solar cell module according to the embodiment of the invention as an example. However the method for manufacturing the solar cell module according to the third embodiment of the invention may be applied to the first example of the solar cell module according to the embodiment of the invention.

Further, the method for manufacturing the solar cell module according to the third embodiment of the invention may be combined with the methods for manufacturing the solar cell module according to the first and second embodiments of the invention. This is described in detail below.

Figure 31:
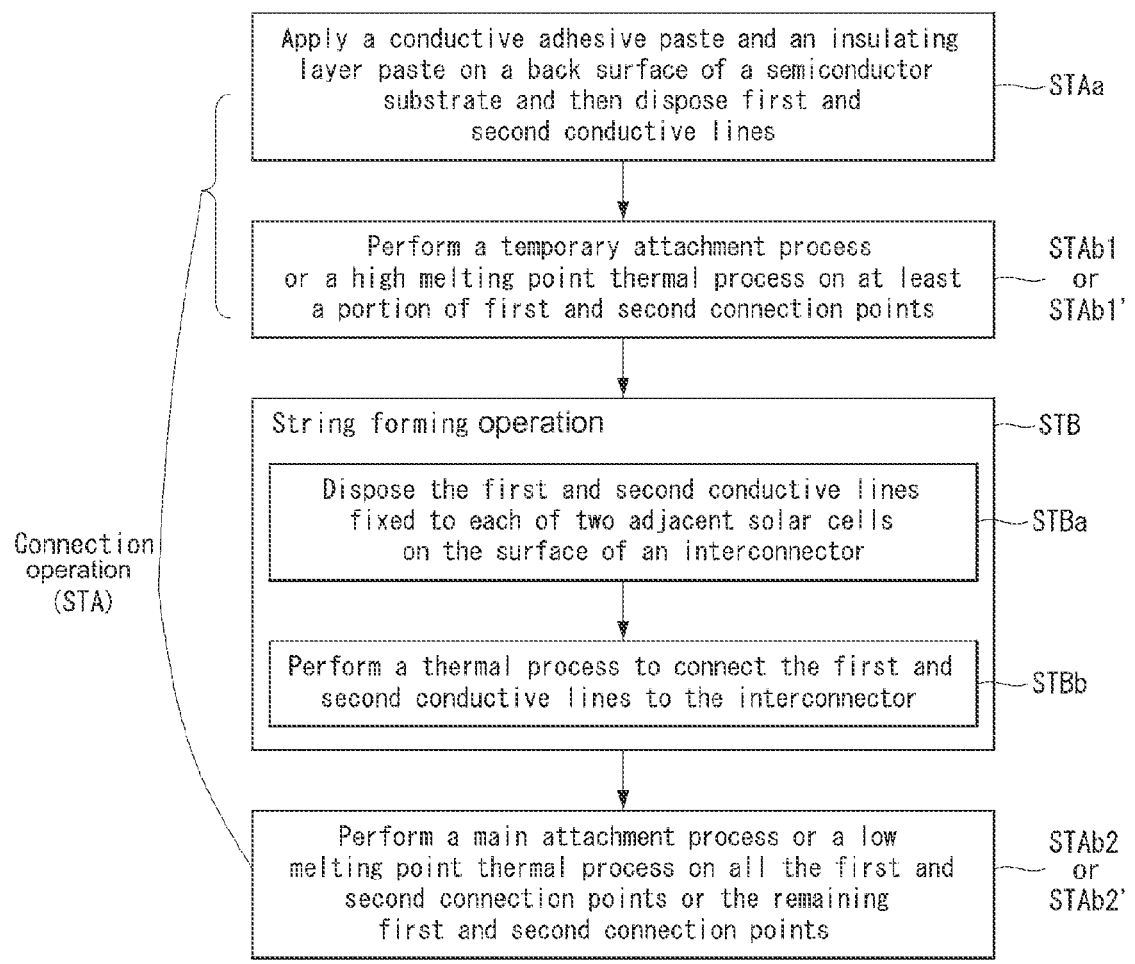
FIG. 31 illustrates a modified example of a method for manufacturing a solar cell module according to the third embodiment of the invention.

FIG. 31 illustrates a modified example of the method for manufacturing the solar cell module according to the third embodiment of the invention.

As shown in FIG. 31, in the modified example of the method for manufacturing the solar cell module according to the third embodiment of the invention, the thermal process STAb of the connection operation STA may include the temporary attachment process STAb1 and the main attachment process STAb2 or the high melting point thermal process STAb1' and the low melting point thermal process STAb2', and the string forming operation STB may be performed between the temporary attachment process STAb1 and the main attachment process STAb2 or between the high melting point thermal process STAb1' and the low melting point thermal process STAb2'.

More specifically, the modified example of the method for manufacturing the solar cell module according to the third embodiment of the invention may perform a process STAa for applying the conductive adhesive paste CAP and the insulating layer paste ILP on the back surface of the semiconductor substrate 110 and then disposing the first and second conductive lines P1 and P2, and then may perform the temporary attachment process STAb1 or the high melting point thermal process STAb1' on at least a portion of the first and second connection points.

Since the temporary attachment process STAb1 or the high melting point thermal process STAb1' in the modified example of the method for manufacturing the solar cell module according to the third embodiment of the invention is substantially the same as that in the method for manufacturing the solar cell module according to the first and second embodiments of the invention, a further description may be briefly made or may be entirely omitted.

Afterwards, in the string forming operation STB, the first and second conductive lines P1 and P2 fixed to each of the two adjacent solar cells may be disposed on the surface of the interconnector IC, and the thermal process may be performed, thereby connecting the first and second conductive lines P1 and P2 to the interconnector IC.

Since the string forming operation STB in the modified example of the method for manufacturing the solar cell module according to the third embodiment of the invention is substantially the same as that in the method for manufacturing the solar cell module according to the first and second embodiments of the invention, a further description may be briefly made or may be entirely omitted.

Next, the main attachment process STAb2 or the low melting point thermal process STAb2' may be performed on all of the first and second connection points or the remaining first and second connection points.

The main attachment process STAb2 or the low melting point thermal process STAb2' may be performed through the lamination process as described above.

In the modified example of the method for manufacturing the solar cell module according to the third embodiment of the invention, the maximum temperatures of the thermal processes of the temporary attachment process STAb1, the main attachment process STAb2, and the string forming operation STB may be different from one another.

For example, when the connection operation STA includes the temporary attachment process STAb1 and the main attachment process STAb2, the maximum temperature of the thermal process in the string forming operation STB may be higher than the maximum temperature of the thermal process in the temporary attachment process STAb1 or the main attachment process STAb2.

For example, the maximum temperature of the thermal process of the string forming operation STB may be 240° C. to 280° C., and the maximum temperature of the thermal process of the temporary attachment process STAb1 may be 70° C. to 150° C.

For example, the maximum temperature of the thermal process of the main attachment process STAb2 may be 140° C. to 180° C. within a temperature range that is higher than the maximum temperature of the thermal process of the temporary attachment process STAb1 and is lower than the maximum temperature of the thermal process of the string forming operation STB. The main attachment process STAb2 may be performed during the lamination process.

Further, the maximum temperatures of the high melting point thermal process STAb1' and the low melting point thermal process STAb2' of the connection operation STA may be different from each other as described in the second embodiment of the invention. The maximum temperature of the thermal process STBb of the string forming operation STB may be different from the maximum temperatures of the high melting point thermal process STAb1' and the low melting point thermal process STAb2'.

The modified example of the method for manufacturing the solar cell module according to the third embodiment of the invention may connect the first and second conductive lines P1 and P2 to the interconnector IC in a state where at least a portion of the first and second conductive lines P1 and P2 is fixed to the first and second electrodes C141 and C142 of each solar cell, and may perform the main attachment process STAb2 or the low melting point thermal process STAb2' through the lamination process. Therefore, the bending of the semiconductor substrate 110 of each solar cell may be minimized.

Further, the maximum temperature of the thermal process STBb of the string forming operation STB may be different from the maximum temperature of the thermal process of the string connection operation STC as in the first embodiment shown in FIG. 16.

Figure 32:
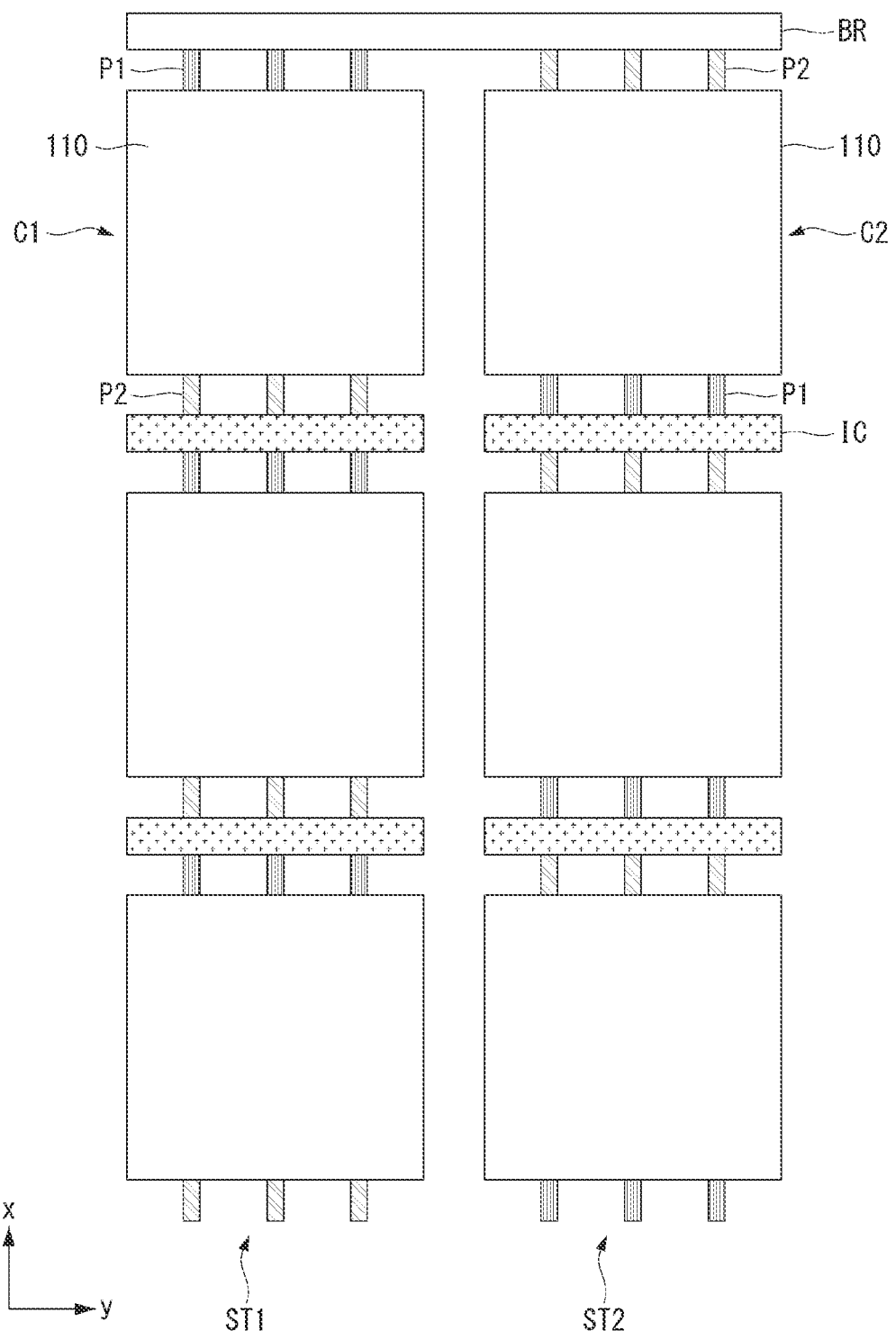
FIG. 32 illustrates a method for manufacturing a solar cell module according to a fourth embodiment of the invention.

FIG. 32 illustrates a method for manufacturing a solar cell module according to a fourth embodiment of the invention.

As described above with reference to FIG. 15, a tabbing operation ST may further include a string connection operation STC. The string connection operation STC may include a process STCa for disposing first and second conductive lines P1 and P2 respectively connected to the last solar cells of two adjacent strings on the surface (for example, a back surface) of a bussing ribbon and a process STCb for performing a thermal process to connect the first and second conductive lines P1 and P2 to the interconnector IC.

Thus, as shown in FIG. 32, the first conductive line P1 included in the last solar cell C1 positioned at an end of a first string ST1 extending in the first direction x and the second conductive line P2 included in the last solar cell C2 positioned at an end of a second string ST2, that is adjacent to the first string ST1 and extends in the first direction x, may be connected to a bussing ribbon BR extending in the second direction y through the string connection operation STC, thereby electrically connecting the adjacent first and second strings ST1 and ST2 in series.

A maximum temperature of the thermal process STCb of the string connection operation STC may be different from a maximum temperature of a thermal process STBb of a string forming operation STB.

For example, the maximum temperature of the thermal process STCb of the string connection operation STC and the maximum temperature of the thermal process STBb of the string forming operation STB may be different from each other within a temperature range of 140° C. to 400° C.

However, the embodiment of the invention is not limited thereto. For example, the maximum temperature of the thermal process STCb of the string connection operation STC and the maximum temperature of the thermal process STBb of the string forming operation STB may be the same as each other within a temperature range of 140° C. to 400° C.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a solar cell module comprising:
    preparing a plurality of solar cells each having a plurality of first electrodes and a plurality of second electrodes positioned in parallel with each other on a back surface of a semiconductor substrate; and
    connecting a first conductive line to the plurality of first electrodes included in each of the plurality of solar cells using a conductive adhesive and a second conductive line to the plurality of second electrodes included in each of the plurality of solar cells using the conductive adhesive by a first thermal process;
    interconnecting the first conductive line of a first solar cell of the plurality of solar cells to an interconnector and the second conductive line of a second solar cell of the plurality of solar cells, which is adjacent to the first solar cell, to the interconnector by a second thermal process; and
    laminating the plurality of the solar cells between a first encapsulant layer and a second encapsulant layer;
    wherein the interconnector is located between the first solar cell and the second solar cell,
    wherein a plurality of first connection points are positioned in a portion where the plurality of first electrodes and the first conductive line cross or overlap each other, and a plurality of second connection points are positioned in a portion where the plurality of second electrodes and the second conductive line cross or overlap each other,
    wherein the first thermal process of the connecting includes:
    a temporary attachment process at a first maximum temperature; and
    a main attachment process at a second maximum temperature higher than the first maximum temperature, and
    wherein the main attachment process is performed along with the laminating.

2. The method of claim 1,
    wherein the temporary attachment process is for thermally processing a portion of the plurality of first connection points and a portion of the plurality of second connection points at the first maximum temperature; and
    the main attachment process is for thermally processing all of the first and second connection points including the portions of the plurality of first and second connection points at the second maximum temperature.

3. The method of claim 2, wherein the first maximum temperature of the temporary attachment process is 70° C. to 150° C., and
    wherein the second maximum temperature of the main attachment process is 140° C. to 400° C. within a temperature range higher than the first maximum temperature.

4. The method of claim 1, wherein the first and second conductive lines are previously patterned on an insulating member, and
    wherein in the connecting, each insulating member having the first and second conductive lines and each semiconductor substrate, on which the plurality of first and second electrodes are formed, are connected to each other to form an individual integrated type element.

5. The method of claim 4, wherein an insulating layer is formed in each portion where the plurality of first electrodes and the second conductive line cross or overlap each other and where the plurality of second electrodes and the first conductive line cross or overlap each other.

6. The method of claim 1, wherein each of the first and second conductive lines is formed as a plurality of conductive wires extending in the first direction or a plurality of conductive ribbons extending in the first direction, and
    wherein in the connecting, the first and second conductive lines formed as the conductive wires or the conductive ribbons are respectively connected to the plurality of first and second electrodes of each solar cell.

7. The method of claim 1, wherein each of the first and second conductive lines overlaps two semiconductor substrates of two adjacent solar cells, and
    wherein the two adjacent solar cells are connected in series to each other by the connecting and the interconnecting.

8. The method of claim 1, wherein the second maximum temperature of the main attachment process of the connecting is different from a maximum temperature of the second thermal process of the interconnecting.

9. The method of claim 8, wherein the second maximum temperature of the main attachment process of the connecting is 140° C. to 400° C., and
    wherein the maximum temperature of the second thermal process of the interconnecting is 140° C. to 400° C. and different from the second maximum temperature of the main attachment process of the connecting.

10. The method of claim 1, wherein the maximum temperature of the second thermal process of the interconnecting is higher than the second maximum temperature of the main attachment process of the connecting.

11. The method of claim 10, wherein the second maximum temperature of the main attachment process of the connecting is 140° C. to 180° C., and wherein the maximum temperature of the second thermal process of the interconnecting is 150° C. to 300° C. within a temperature range higher than the second maximum temperature of the main attachment process of the connecting.

12. The method of claim 10, wherein the maximum temperature of the second thermal process of the interconnecting is 240° C. to 280° C.

13. The method of claim 1, wherein the second thermal process of the interconnecting includes another temporary attachment process and another main attachment process performed at a maximum temperature higher than a maximum temperature of the temporary attachment process, and wherein the maximum temperature of the another temporary attachment process of the interconnecting is 80° C. to 100° C., and the maximum temperature of the another main attachment process of the interconnecting 170° C. to 190° C.

14. The method of claim 1, the method further includes a string connecting the first conductive line connected to the last solar cell positioned at an end of one string extending in the first direction and the second conductive line connected to the last solar cell positioned at an end of another string, that is adjacent to the one string and extends in the first direction, to a bussing ribbon extending in a second direction crossing the first direction by a third thermal process in order to connect the two adjacent strings, and wherein a maximum temperature of the third thermal process of the string connecting is different from a maximum temperature of the second thermal process of interconnecting.

15. The method of claim 14, wherein the maximum temperature of the third thermal process of the string connecting and the maximum temperature of the second thermal process of the interconnecting are different from each other, and the maximum temperature of the third thermal process of the string connecting is 140° C. to 400° C.

* * * * *